(12) United States Patent
Okazaki et al.

(10) Patent No.: US 8,773,751 B2
(45) Date of Patent: Jul. 8, 2014

(54) OPTICAL DEVICE, EXPOSURE APPARATUS AND LASER APPARATUS

(75) Inventors: Masahide Okazaki, Kyoto (JP); Toshiaki Suhara, Osaka (JP)

(73) Assignee: Dainippon Screen Mfg. Co., Ltd. (JP)

( * ) Notice: Subject to any disclaimer, the term of this patent is extended or adjusted under 35 U.S.C. 154(b) by 148 days.

(21) Appl. No.: 13/349,182

(22) Filed: Jan. 12, 2012

(65) Prior Publication Data

US 2012/0182535 A1    Jul. 19, 2012

(30) Foreign Application Priority Data

Jan. 14, 2011  (JP) .................................. 2011-006130

(51) Int. Cl.
*G02F 1/377*    (2006.01)

(52) U.S. Cl.
USPC .............................. 359/329; 359/328; 372/22

(58) Field of Classification Search
USPC ........................ 359/245, 326–332; 372/21–22
See application file for complete search history.

(56) References Cited

U.S. PATENT DOCUMENTS

| | | | |
|---|---|---|---|
| 5,898,718 A * | 4/1999 | Mohatt et al. .................... | 372/22 |
| 7,354,157 B2 | 4/2008 | Takeda et al. | |
| 7,999,998 B2 * | 8/2011 | Morikawa et al. ............ | 359/328 |
| 8,073,022 B2 * | 12/2011 | Furuya et al. .................... | 372/21 |
| 8,073,024 B2 | 12/2011 | Yanagisawa et al. | |
| 8,173,982 B2 * | 5/2012 | Edamatsu et al. ......... | 250/493.1 |
| 8,508,841 B2 * | 8/2013 | Chou et al. .................... | 359/328 |
| 2004/0096160 A1 * | 5/2004 | Hinkov et al. ................... | 385/40 |
| 2010/0166356 A1 | 7/2010 | Okazaki et al. | |

FOREIGN PATENT DOCUMENTS

| | | |
|---|---|---|
| EP | 2 202 568 A2 | 6/2010 |
| JP | 6-43513 | 2/1994 |
| JP | 2007-47638 | 2/2007 |
| JP | 2009-31732 | 2/2009 |
| JP | 2010-152214 | 7/2010 |
| WO | 2009/016709 | 2/2009 |

OTHER PUBLICATIONS

Yi Chiu, et al. "Integrated Optical Device with Second-Harmonic Generator, Electrooptic Lens, and Electrooptic Scanner in LiTaO3", Journal of Lightwave Technology, IEEE Service Center, New York, NY, vol. 17, No. 3, pp. 462-465, Mar. 1, 1999.
K. Kintaka, et al. "Third Harmonic Generation of Nd:YAG Laser Light in Periodically Poled LiNbO3 Waveguide", Electronics Letters, IEE Stevenage, GB, vol. 33, No. 17, pp. 1459-1461, Aug. 14, 1997.
M. Yamada and M. Saitoh "Electric-Field Induced Cylindrical Lens, Switching and Deflection Devices Composed of the Inverted Domains in LiNbO3 Crystals", Applied Physics Letters, AIP, American Institute of Physics, Melville, NY, vol. 69, No. 24, pp. 3659-3661, Dec. 9, 1996.
Extended European Search Report date of completion May 18, 2012, date of Reported May 30, 2012 for corresponding European Application No. 12150623.2.

* cited by examiner

*Primary Examiner* — Daniel Petkovsek
(74) *Attorney, Agent, or Firm* — Ostrolenk Faber LLP

(57) ABSTRACT

As a spatial light modulator 35 is disposed between a wavelength conversion part 315 and an exit surface 311*b* in a ferroelectric crystal substrate 31, only zeroth-order light which is at a particular wavelength is guided to a substrate while laser light from the wavelength conversion part 315 is being modulated, whereby a pattern corresponding to LSI data is drawn. Further, the spatial light modulator 35 is disposed together with the wavelength conversion parts 314 and 315 inside the ferroelectric crystal substrate 31.

31 Claims, 17 Drawing Sheets

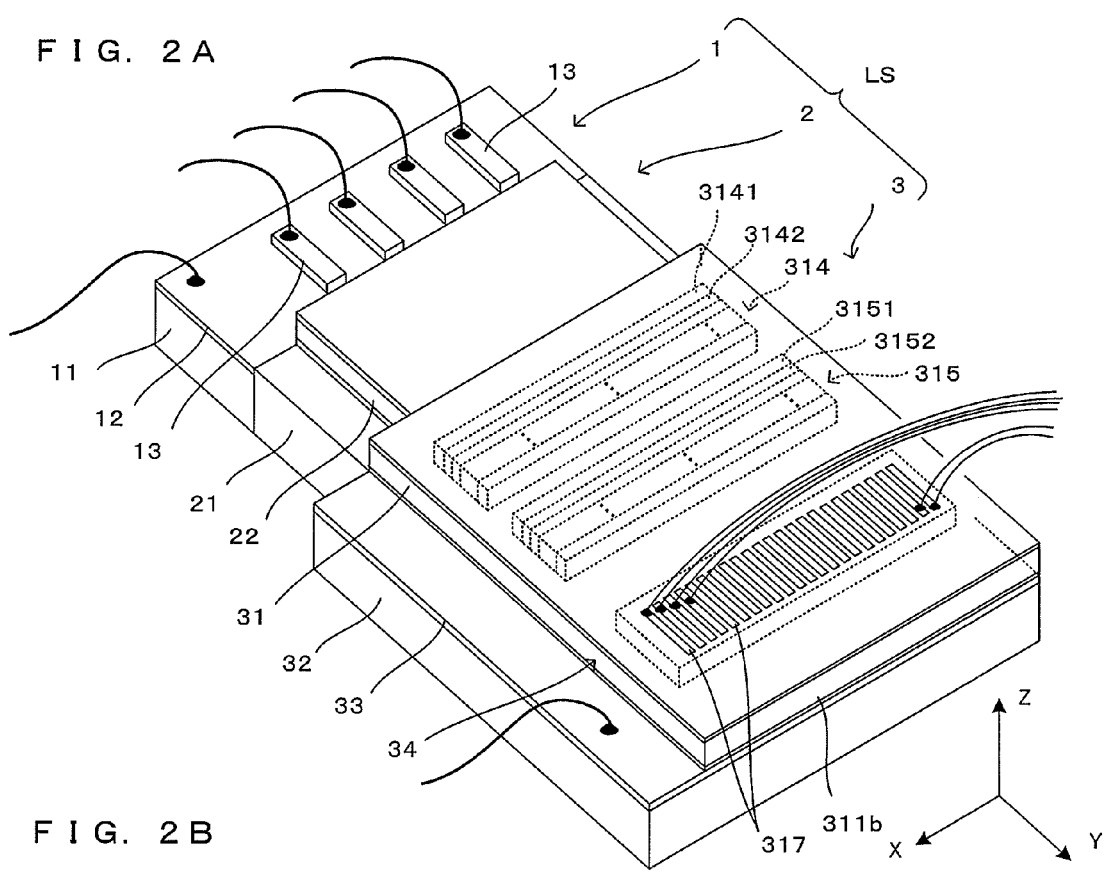
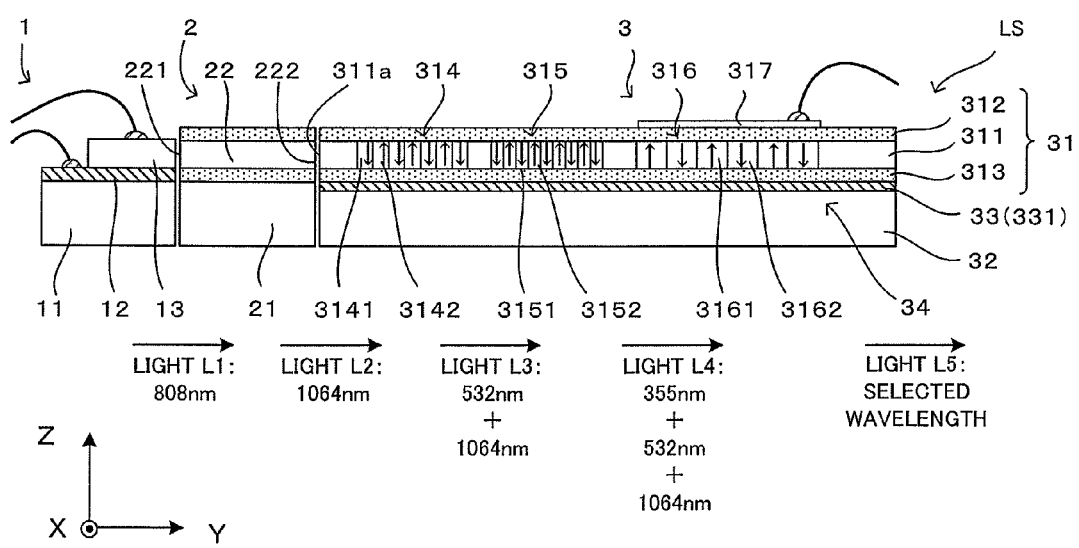

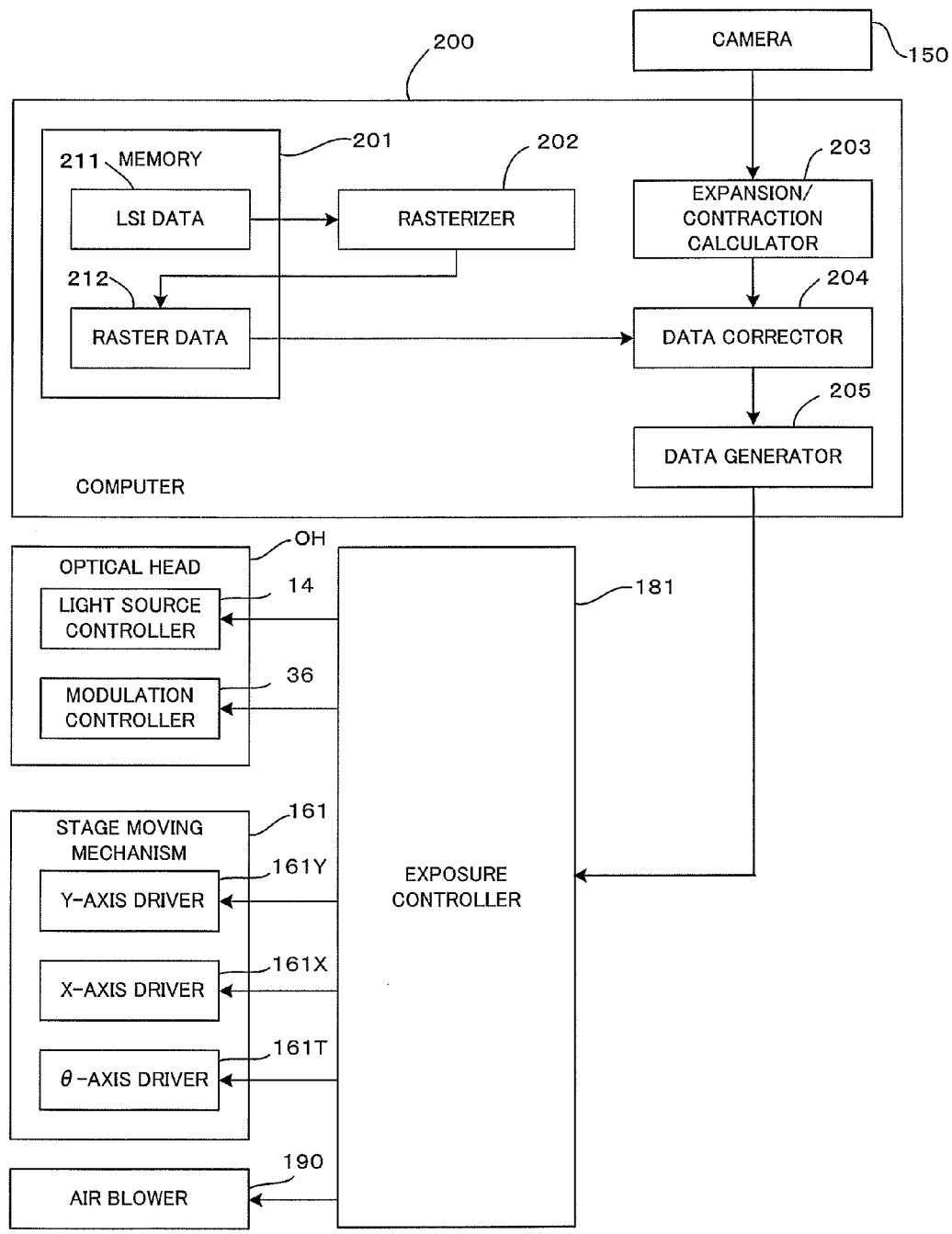

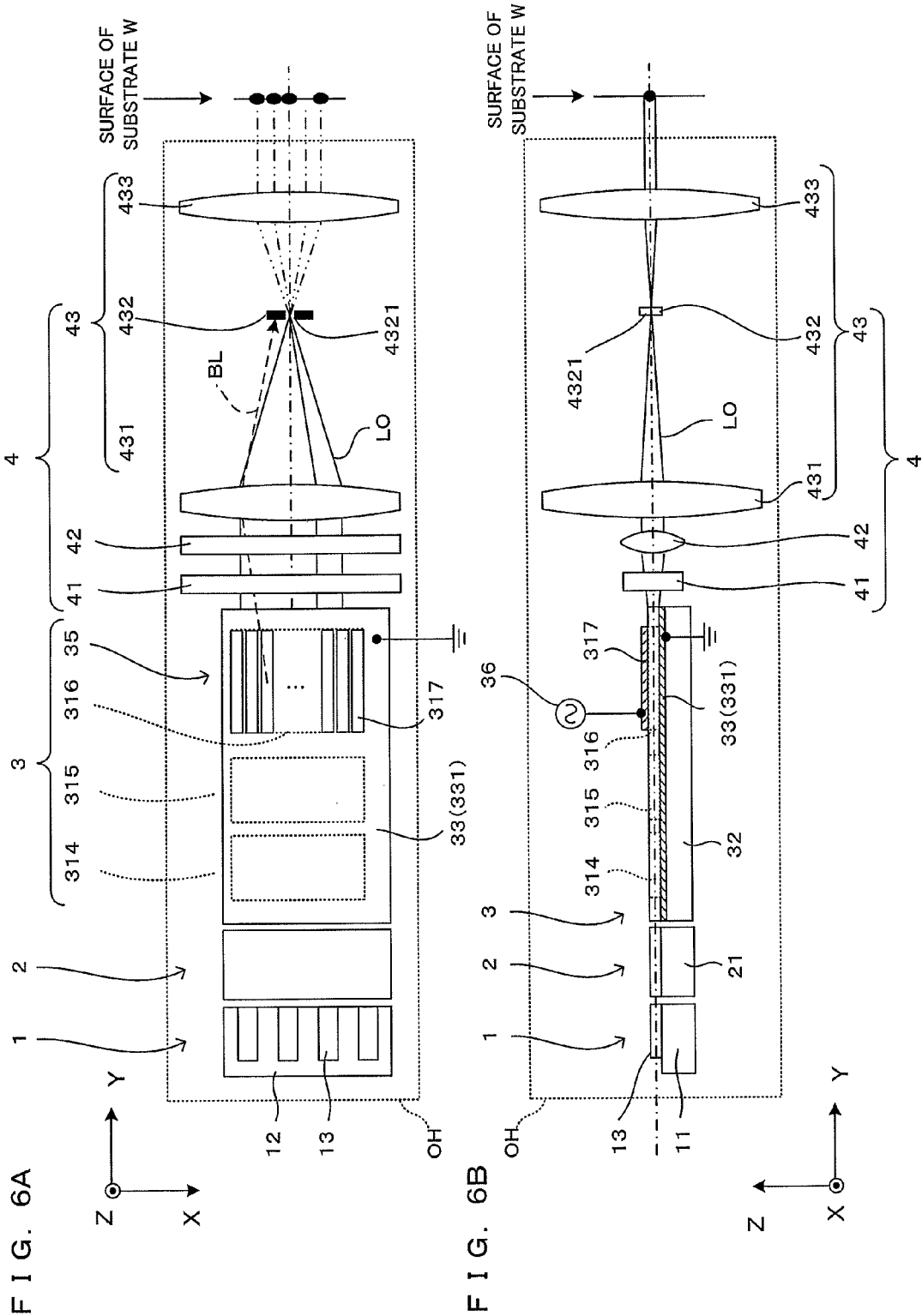

OPTICAL DEVICE, EXPOSURE APPARATUS AND LASER APPARATUS

CROSS REFERENCE TO RELATED APPLICATION

The disclosure of Japanese Patent Application No. 2011-6130 filed on Jan. 14, 2011 including specification, drawings and claims is incorporated herein by reference in its entirety.

BACKGROUND OF THE INVENTION

1. Field of the Invention

The present invention relates to an optical device equipped with a wavelength conversion function (hereinafter referred simply to "the optical device"), a laser apparatus which uses the optical device, and an exposure apparatus which uses the optical device.

2. Description of the Related Art

A number of proposals have been made as for an optical device which uses a ferroelectric crystal substrate of a ferroelectric crystal to perform wavelength conversion, light modulation, etc., and as for an apparatus comprising the optical device. JP-A-2009-31732 for instance discloses an apparatus which performs exposure processing using an optical device which performs light modulation. The apparatus comprises a light source which is formed by a semiconductor laser or the like to emit a light beam of a predetermined wavelength. The laser light from the light source, after getting shaped into a parallel light beam by an illumination optical system, impinges upon the optical device (spatial light modulator). In this optical device, a ferroelectric crystal is provided in the form of thin plate or slab, and a plurality of electrode elements are arranged at constant intervals on one major surface or the both major surfaces of the ferroelectric crystal, thereby forming a grid electrode. As an electric potential difference is applied between the electrode elements, an electric field develops in the ferroelectric crystal, whereby the refractive index periodically changes in the ferroelectric crystal and a diffraction grating is formed. Light is made incident upon the ferroelectric crystal in an approximately parallel direction to the longitudinal direction of the grid electrode so that Raman-Nath diffraction is primarily created, which realizes spatial light modulation.

It is beneficial to use wavelength conversion techniques which have been proposed for the purpose of reducing the size of such an apparatus and securing a proper wavelength. The technique according to WO2009/016709 for example proposes providing a wavelength conversion part in a ferroelectric crystal substrate to consequently shorten the wavelength of near-infrared laser light. This conventional technique uses an optical device in which a waveguide second harmonic generation (SHG) part is formed in a ferroelectric crystal substrate. In short, a fundamental emitted from a solid laser element is allowed to propagate to the second harmonic generation part provided in the optical device, and a wavelength-converted second harmonic is obtained which has half the wavelength of the fundamental (i.e., which has double the frequency of the fundamental) owing wavelength conversion. Therefore, application of the laser apparatus described in WO2009/016709 to the exposure apparatus (optical head) described in JP-A-2009-31732 makes it possible to reduce the apparatus size.

Further proposal has been made to additionally dispose an optical device which comprises a sum frequency generation (SFG) part subsequent to the optical device which comprises the second harmonic generation part in an attempt to shorten the wavelength of the laser light for use in the exposure apparatus.

However, whichever it is between when two or more wavelength conversion optical devices are combined to emit light at a predetermined wavelength and when a wavelength conversion optical device and light modulation optical device are combined, as these optical devices are all discrete elements, their optical axes must be aligned to each other at a high accuracy. A change in the temperature environment, a humidity variation, and heat developed in the optical devices, etc. could deviate the optical axes alignment, which then could destabilize the optical performances such as the light amount stability, the efficiency of wavelength conversion and the efficiency of light modulation.

SUMMARY OF THE INVENTION

The invention has been made in light of the problems described above. Accordingly, an object of the invention is to provide an optical device with excellent optical performances which allow to combine stably and highly efficiently a plurality of wavelength conversions with each other or combine wavelength conversion with light modulation, a laser apparatus which uses the optical device to stably generate laser light having a desired wavelength, and an exposure apparatus which uses the optical device to irradiate a surface-to-be-exposed with light having a desired wavelength and accordingly exposes the surface-to-be-exposed.

An aspect of an optical device according to the present invention comprises: a ferroelectric crystal substrate, formed by a ferroelectric crystal, that includes an incident surface upon which light impinges, an exit surface which is opposed to the incident surface, a first periodically poled part which is disposed between the incident surface and the exit surface, a second periodically poled part which is different from the first periodically poled part and disposed between the first periodically poled part and the exit surface, and a support surface which is different from the incident surface or the exit surface; a support substrate that includes an opposed surface which is opposed to the support surface; and a metal film, disposed between the support surface and the opposed surface, that integrates the ferroelectric crystal substrate with the support substrate, wherein the first periodically poled part performs wavelength conversion of light that impinges upon the incident surface and the second periodically poled part performs wavelength conversion or modulation of light that is outputted from the first periodically poled part.

In the optical device, the two periodically poled parts which are different from each other are provided in the ferroelectric crystal substrate formed by the ferroelectric crystal, and the first periodically poled part performs wavelength conversion of light impinging upon the incident surface. The second periodically poled part performs wavelength conversion or light modulation of the light outputted from the first periodically poled part. Within the ferroelectric crystal substrate, processing which combines a plurality of wavelength conversions (two-step wavelength conversion) or processing which combines wavelength conversion with light modulation is performed. It is thus possible to perform such combination processing stably and highly efficiently and attain excellent optical performances. In addition, since the ferroelectric crystal substrate is integrated with the support substrate by the metal film, it is possible to control the length of the optical path and form the periodically poled structures within the ferroelectric crystal substrate as it is integrated with the support substrate. This makes it possible to form the ferroelectric crystal substrate as a thin film and form the periodically poled parts at a high accuracy, and therefore, further improve the optical performances.

A first aspect of an exposure apparatus according to the present invention comprises: the optical device, wherein the second periodically poled part is a second wavelength conversion part, and the ferroelectric crystal substrate includes a light modulator, disposed between the second periodically poled part and the exit surface, that modulates light which is outputted from the second periodically poled part; a light source that outputs light to the incident surface of the ferroelectric crystal substrate; and an optical system that guides to a substrate-to-be-exposed the light which is outputted from the exit surface after getting modulated by the light modulator of the ferroelectric crystal substrate.

A second aspect of an exposure apparatus according to the present invention comprises: the optical device, wherein the second periodically poled part is a light modulator that modulates the light which is outputted from the first periodically poled part; a light source that outputs light to the incident surface of the ferroelectric crystal substrate; and an optical system that guides to a substrate-to-be-exposed the light which is outputted from the exit surface after getting modulated by the light modulator of the ferroelectric crystal substrate.

A third aspect of an exposure apparatus according to the present invention comprises: the optical device, wherein the ferroelectric crystal substrate includes an optical system, disposed between the light modulator and the exit surface, that has a first lens for condensing light which is outputted from the light modulator; a light source that outputs light to the incident surface of the ferroelectric crystal substrate; and a second lens which is disposed between the exit surface of the ferroelectric crystal substrate and a substrate-to-be-exposed, wherein the first lens condenses light from the light modulator in the orthogonal direction to the crystallographic axial direction of the ferroelectric crystal substrate, and the second lens condenses light from the exit surface of the ferroelectric surface along at least the crystallographic axial direction.

A fourth aspect of an exposure apparatus according to the present invention comprises: the optical device, wherein the ferroelectric crystal substrate includes an optical system, disposed between the light modulator and the exit surface, that has a first lens for condensing light which is outputted from the light modulator; a light source that outputs light to the incident surface of the ferroelectric crystal substrate; and a second lens which is disposed between the exit surface of the ferroelectric crystal substrate and a substrate-to-be-exposed, wherein the first lens condenses light from the light modulator in the orthogonal direction to the crystallographic axial direction of the ferroelectric crystal substrate, and the second lens condenses light from the exit surface of the ferroelectric surface along at least the crystallographic axial direction.

In the exposure apparatus according to the invention, aligning the optical axes to each other inside the exposure apparatus is easy and stable exposure is possible. In the event that the light source emits near infrared laser light, the first periodically poled part is a second harmonic generation part, the second periodically poled part is a sum frequency generation part and the light modulator is provided between the second periodically poled part and the exit surface, it is possible to expose with laser light belonging to the ultraviolet region.

An aspect of a laser apparatus according to the present invention comprises: the optical device; and a light source that outputs light to the incident surface of the ferroelectric crystal substrate. In the laser apparatus according to the present invention, aligning the optical axes to each other inside the laser apparatus is easy and laser light having a desired wavelength can be emitted in a stable manner. In the event that the light source emits near infrared laser light, the first periodically poled part is a second harmonic generation part and the second periodically poled part is a sum frequency generation part, it is possible to stably emit laser light belonging to the ultraviolet region.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTIONS OF THE DRAWINGS

FIG. 2A is a perspective view which shows the structure of the laser apparatus which uses the optical device according to the second embodiment of the invention;

FIG. 2B is a cross sectional view of the laser apparatus shown in FIG. 2A;

FIG. 5 is a part diagram which shows the electric structure of the pattern drawing apparatus;

FIGS. 6A and 6B are simplified drawings which show the structure inside the optical head;

DETAILED DESCRIPTION OF THE PREFERRED EMBODIMENTS

One aspect of the invention is directed to an optical device which performs multi-step wavelength conversion by means of mutually different periodically-poled parts, as well as to a laser apparatus which uses the optical device. The periodically-poled parts are provided a ferroelectric crystal in a ferroelectric crystal substrate which is supported by a support substrate via a metal film. Other aspect of the invention is directed to an optical device which comprises one or a plurality of periodically-poled parts for wavelength conversion and a periodically poled part for light modulation, as well as to an exposure apparatus which uses the optical device. For the purpose of further clarifying the effect of the invention, the invention will now be described in relation to "A. Laser Apparatus Using Optical Device of the Invention" and "B. Exposure Apparatus Using Optical Device of the Invention."

A. Laser Apparatus Using Optical Device of the Invention

A-1. Laser Apparatus Using Optical Device of the First Embodiment

Figure 1A:
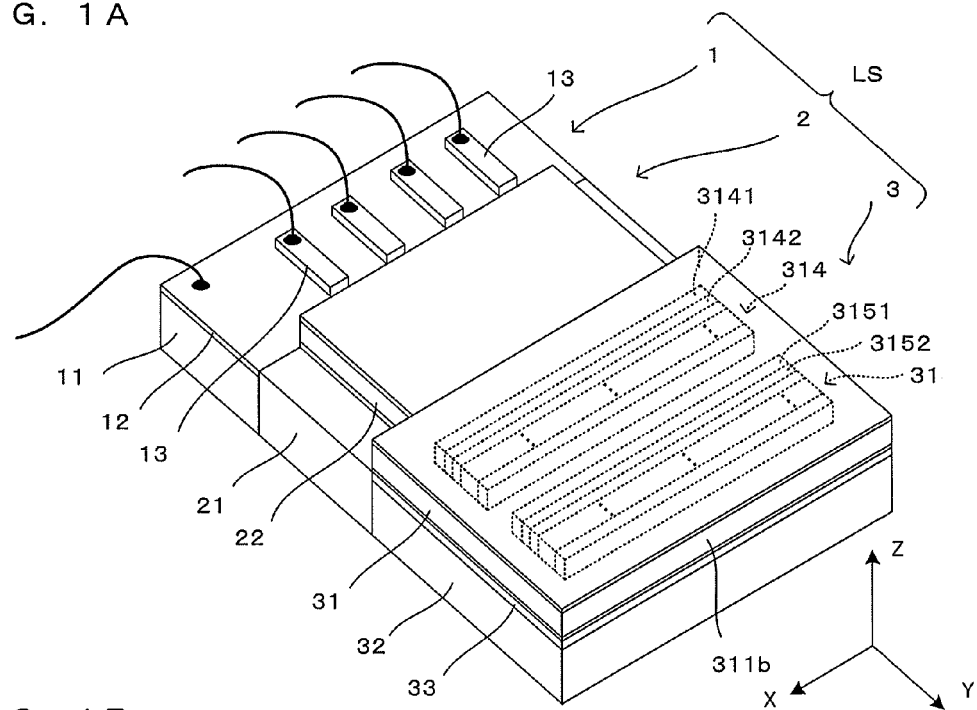
FIG. 1A is a perspective view which shows the structure of the laser apparatus which uses the optical device according to the first embodiment of the invention.
Figure 1B:
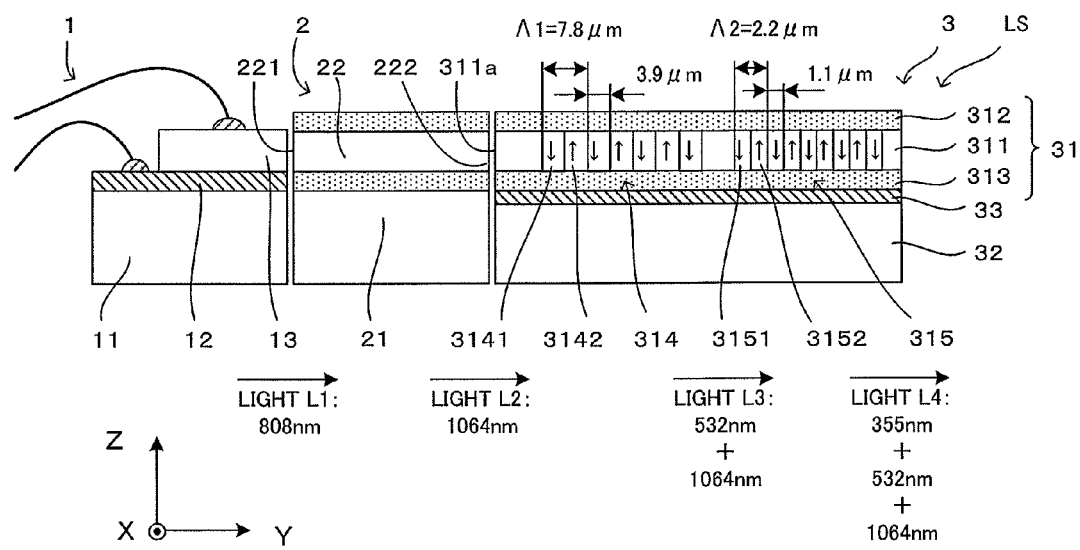
FIG. 1B is a cross sectional view of the laser apparatus shown in FIG. 1A.

FIG. 1A is a perspective view which shows the structure of the laser apparatus which uses the optical device according to the first embodiment of the invention, and FIG. 1B is a cross sectional view of the laser apparatus shown in FIG. 1A. FIGS. 1A and 1B are schematic drawings, and therefore, the sizes of the respective parts and the size ratios of these parts to each other are different from actual sizes and ratios. This similarly applies to the drawings which will be referred to later as well.

The laser apparatus LS comprises a pumping light source 1, a solid state laser section 2 and an optical device 3. The solid state laser section 2 uses laser light L1 from the pumping light source 1 as pump light and oscillates in accordance with amplification of the laser light. The optical device 3 converts the wavelength of laser light L2 from the solid state laser section 2 belonging to the near infrared region (the wavelength of 1064 nm) over two steps and accordingly converts this laser light into laser light which belongs to the ultraviolet region.

The pumping light source 1 comprises a support substrate 11, a common electrode 12 which is disposed in the top surface of the support substrate 11, and four semiconductor lasers 13 which are provided in the top surface of the common electrode 12. The four semiconductor lasers 13 are arranged along the width direction X. As predetermined electric potentials are applied upon electrodes (not shown) which are disposed in the top surfaces of the semiconductor lasers 13 and the common electrode 12, each semiconductor laser 13 emits the pump light L1 along the optical axis direction Y which is orthogonal to the width direction X and the pump light L1 irradiates the solid state laser section 2. The direction in which the laser light propagates is thus herein described as the optical axis direction Y.

The solid state laser section 2 comprises a support substrate 21 and a solid laser element 22 which is disposed in the top surface of the support substrate 21. The solid laser element 22 is shaped as a flat plate and has both end facets which are perpendicular to the optical axis direction Y. One of these end facets which is directed toward the semiconductor lasers 13 is an incident facet 221 which receives the pump light L1 from the semiconductor lasers 13. The end surface directed to the opposite side to the semiconductor lasers is an exit facet 222. An optical waveguide structure is formed inside an element which is held between the incident facet 221 and the exit facet 222 so that the pump light L1 from the semiconductor lasers 13 is absorbed and laser light generated by induction discharging is allowed to propagate along the optical axis direction Y and exits the exit facet 222. In this embodiment, the solid laser element 22 is formed by an Nd:YAG crystal layer and clad layers which contact this crystal layer on the top and bottom surfaces of the crystal layer. The Nd:YAG crystal layer absorbs the pump light L1 from the semiconductor lasers 13 and emits laser light L2 having the wavelength of 1064 nm. The crystal layer may be made of Nd:YVO$_4$ for example instead of Nd:YAG, in which case the laser light L2 having the wavelength of 1064 nm or 914 nm is emitted primarily. In this embodiment, the pumping light source 1 and the solid state laser section 2 thus form "the light source" of the invention.

An optical device 3 receives the laser light L2 belonging to the near infrared region emitted from the solid state laser section 2 which has the structure described above. The optical device 3 corresponds to the first embodiment of the optical device according to the invention. The optical device 3 comprises a ferroelectric crystal substrate 31 formed by a ferroelectric crystal, a support substrate 32 which supports the ferroelectric crystal substrate 31 from below and a metal film 33. The metal film 33 is inserted between the bottom surface of the ferroelectric crystal substrate 31 and the top surface of the support substrate 32. This makes the support substrate 32 support the ferroelectric crystal substrate 31 and integrates the support substrate 32 with the ferroelectric crystal substrate 31. The bottom surface of the ferroelectric crystal substrate 31 thus corresponds to "the support surface" of the invention and the top surface of the support substrate 32 corresponds to "the opposed surface" of the invention.

The ferroelectric crystal substrate 31 comprises the ferroelectric crystal 311 shaped like a flat plate and insulation layers 312, 313 which are formed on the top and the bottom surfaces of the ferroelectric crystal substrate 31. The ferroelectric crystal 311 has both end facets which are orthogonal to the optical axis direction Y, of which one end facet faced to the solid laser element 22 is an incident surface 311a which receives the laser light L2 emitted from the solid laser element 22. Meanwhile, the other end surface on the opposite side to the solid laser element is an exit surface 311b. The ferroelectric crystal 311 is held between the insulation layers 312 and 313 along the vertical direction Z, whereby a step-index type slab waveguide is formed inside the crystal. Due to this, the laser light L2 impinging upon via the incident surface 311a propagates inside the crystal along the optical axis direction Y while staying contained inside the slab waveguide in the vertical direction Z. In the first embodiment and the subsequent embodiments described below, a single crystal of stoichimetric lithium tantalate to which magnesium oxide (MgO) has been added (MgO:Stoichimetric Lithium Tantalite), which will hereafter be referred to simply as "MgO:SLT," is used as the ferroelectric crystal 311. Silicon oxide films having a thickness of approximately 0.5 through 1.0 µm are used as the insulation layers 312 and 313.

Further, two types of wavelength conversion parts 314 and 315 are formed in the ferroelectric crystal 311. The wavelength conversion part 314 has a periodically poled structure that first and second polarized segments 3141 and 3142 which are polarized in the opposite directions to each other are alternately arranged. A domain-inverted grating is thus formed in the wavelength conversion part 314. Describing more specifically, the first and the second polarized segments 3141 and 3142 are all shaped as stripes which extend in the width direction X. Polarized pairs each consisting of the first polarized segment 3141 and the second polarized segment 3142 which are adjacent to each other are lined up periodically in a predetermined period Λ1 in the optical axis direction Y. In this embodiment, as shown in FIG. 1B, the thicknesses of the first and the second polarized segments 3141 and 3142 are all 3.9 µm in the optical axis direction Y, and the period Λ1 takes a value of 7.8 µm. The wavelength conversion part 314 therefore functions as an waveguide second harmonic generation part and generates laser light which is at 532 nm which is half the wavelength of the laser light L2 impinging upon the wavelength conversion part 314 via the incident surface 311a. Therefore, the laser light L3 outputted from the wavelength conversion part 314 contains:

second harmonic light (having the wavelength of 532 nm); and light (having the wavelength of 1064 nm) which has been transmitted without getting converted by the wavelength conversion part 314, and is allowed to the next wavelength conversion part 315. The wavelength conversion part 314 thus corresponds to "the first periodically poled part" and "the first wavelength conversion part" of the invention.

Like the wavelength conversion part 314, the wavelength conversion part 315 has a periodically poled structure in which first and second polarized segments 3151 and 3152 which are polarized in the opposite directions to each other are alternately arranged so that a domain-inverted grating is formed. Describing more specifically, polarized pairs each consisting of the first polarized segment 3151 having the thickness of approximate 1.1 μm and the second polarized segment 3152 having the thickness of approximate 1.1 μm which are adjacent to each other are arranged periodically in a predetermined period Λ2 (=approximate 2.2 μm) in the optical axis direction Y. The wavelength conversion part 315 functions as a sum frequency generation part and generates sum frequency light (the wavelength of 355 nm) of the second harmonic light (the wavelength of 532 nm) and the light (the wavelength of 1064 nm) which has been transmitted without getting converted by the wavelength conversion part 314. Therefore, the laser light L4 outputted from the wavelength conversion part 315 contains:

light (the wavelength of 1064 nm) which has been converted neither by the wavelength conversion parts 314 and 315 and then transmitted;

second harmonic light (the wavelength of 532 nm) generated by the wavelength conversion part 314 and has been transmitted without getting converted by the wavelength conversion part 315; and third harmonic light (the wavelength of 355 nm) generated by the wavelength conversion part 315, and is outputted from the ferroelectric crystal substrate 31 at the exit surface 311b. The wavelength conversion part 315 thus corresponds to "the second periodically poled part" and "the second wavelength conversion part" of the invention.

As described above, the optical device 3 according to the first embodiment performs wavelength conversion over two steps (1064 nm→532 nm→355 nm) inside the ferroelectric crystal substrate 31. This solves the problem with the conventional techniques which is associated with the combination of a second harmonic generator and a sum frequency generator which are respectively discrete elements, i.e., it is not necessary to highly precisely align the optical axes. Further, this prevents influencing factors such as a temperature or humidity change and heat which light itself creates from destroying the alignment of the optical axes, and accordingly stabilizes the optical performances such as the light intensity stability and the efficiency of frequency conversion.

In addition, since wavelength conversion is performed while constraining the laser light L2, which is allowed by the created slab waveguide to impinge via the light incident surface 311a, inside the slab waveguide in the ferroelectric crystal substrate 31 according to the embodiment above, the wavelength conversion efficiency is better as compared with that achieved by an optical device of the so-called bulk type. In the wavelength conversion part 314, the domain-inverted grating, which inverts the polarization of the ferroelectric crystal 311 periodically, is formed so that a periodic sign-inverted structure of secondary non-linear optical tensor is obtained. Therefore, phase velocity mismatch between the pump light and the second harmonic light is compensated so as to achieve quasi phase matching. Use of the quasi phase matching (QPM) method in this manner enhances the efficiency of wavelength conversion performed by the wavelength conversion part 314. This is true with the wavelength conversion part 315 as well.

In addition, since the metal film 33 integrates the ferroelectric crystal substrate 31 with the support substrate 32 as described above, excellent optical performances are secured. That is, such a structure makes it possible to control the thickness of the ferroelectric crystal 311 which forms the ferroelectric crystal substrate 31 as it is integrated with the support substrate 32 and form the periodically poled structures highly precisely. The ferroelectric crystal substrate 31 is integrated with the support substrate 32, for example in the following way. The bottom surface of the ferroelectric crystal substrate 31, which still does not have the insulation layer 312 yet, and the top surface of the support substrate 32 are coated with a metallic material. These coated surfaces are tightly adhered to each other and the metal film 33 is accordingly formed. As the top surface of the ferroelectric crystal substrate 31, namely, the top surface of the ferroelectric crystal 311 is polished in this state, the crystal thickness of the ferroelectric crystal 311 is reduced down to a desired thickness. Further, it is possible by the known voltage applying method to form highly accurately the periodically poled structures in the ferroelectric crystal 311. Superior optical performances are consequently achieved. The metallic material of the metal film 33 may be for instance gold, chromium, etc.

In addition, since the laser apparatus LS is formed using the optical device 3 which thus has the excellent optical performances, it is easy to align the optical axes to each other inside the laser apparatus LS and it is possible to stably output laser light which is at a desired wavelength.

A-2. Laser Apparatus Using Optical Device of the Second Embodiment

FIG. 2A is a perspective view which shows the structure of the laser apparatus which uses the optical device according to the second embodiment of the invention, and FIG. 2B is a cross sectional view of the laser apparatus shown in FIG. 2A. A major difference of the optical device according to the second embodiment from the optical device according to the first embodiment is that the optical device according to the second embodiment additionally comprises a wavelength converter 34. The optical device according to the second embodiment is otherwise basically the same in terms of structure as that of the optical device according to the first embodiment. The same structures will therefore simply be denoted at the same reference symbols but will not be described again.

The wavelength converter 34 comprises a periodically poled part 316 which is located between the wavelength conversion part 315 and the exit surface 311b. A plurality of electrodes 317 are provided above the periodically poled part 316 so as to sandwich the periodically poled part 316 with the metal film 33 which covers the entire top surface of the support substrate 32. In this embodiment, the metal film 33 is disposed opposed to the plurality of electrodes 317, and functions as a common electrode 331 which is for forming a diffraction grating in the periodically poled part 316 which has the structure described below.

Figure 8A:
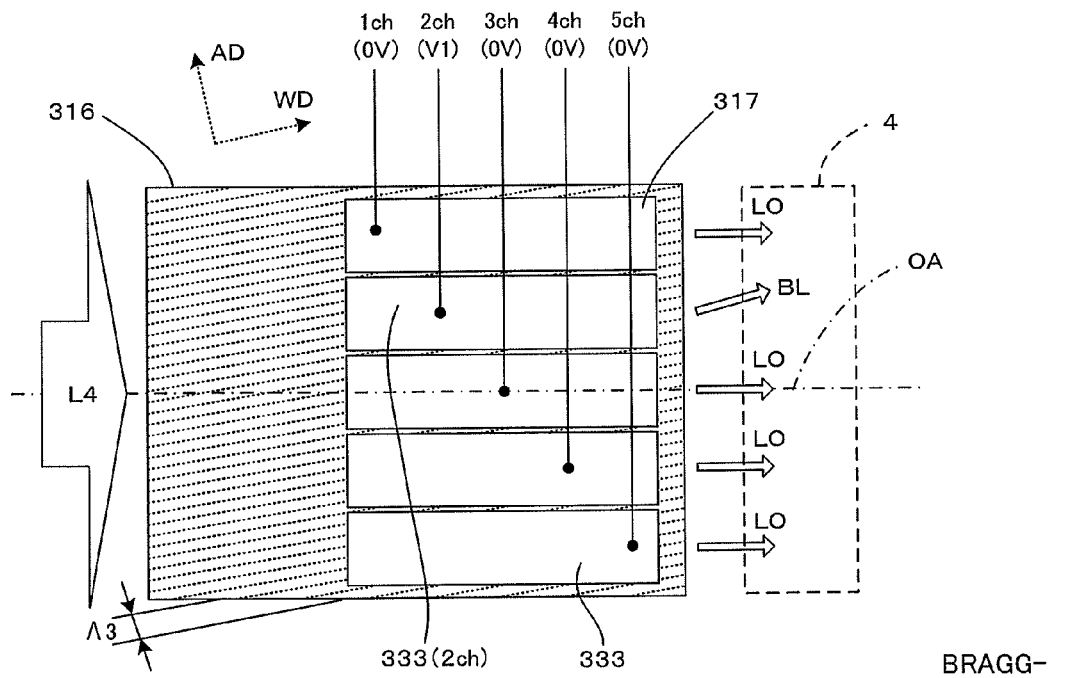
FIGS. 8A and 8B are partially expanded schematic views of the spatial light modulator.
Figure 8B:
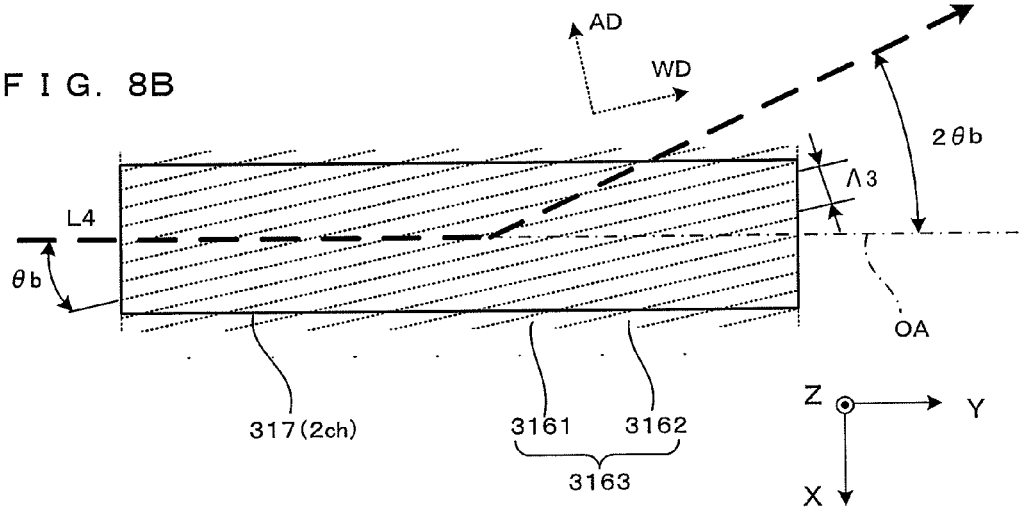

Like the wavelength conversion parts 314 and 315, the periodically poled structure 316 has a periodically poled structure that first and second polarized segments 3161 and 3162 which are polarized in the opposite directions to each other are alternately arranged. The direction in which the polarized segments are arranged is however inclined at a predetermined angle θb with respect to the optical axis direction Y (FIG. 8B). The plurality of electrodes 317 are all shaped as slabs which extend along the direction in which the laser light propagates, i.e., parallel to the optical axis direction Y, and are arranged spaced apart from each other at predetermined intervals in the width direction X. Further, the common electrode 331 of the metal film 33 covers the entire ferroelectric crystal substrate 31 from below, while partially extending in the width direction X as a wing-like portion which is grounded.

The wavelength converter 34 is thus comprised in effect of the periodically poled part 316, the plurality of electrodes 317 and the common electrode 331, and as a controller (not shown) controlling the laser apparatus LS applies a predetermined electric potential upon the electrodes 317, an electric field which consequently develops between the electrodes 317 and the common electrode 311 gives rise to a change of the refractive index in accordance with the orientation of polarization and therefore creates a diffraction grating in the periodically poled part 316. Further, in this embodiment, the inclination angle θb of the direction in which the first and the second polarized segments 3161 and 3162 are arranged is set so as to satisfy a condition which will make it possible for the diffraction grating formed in the manner above to create the Bragg grating. Hence, only particular light contained in the laser light L4 outputted from the wavelength conversion part 315 due to the Bragg diffraction, e.g., laser light belonging to the ultraviolet region, is a diffracted and emitted from the wavelength converter 34 as a diffracted light which is inclined within a horizontal plane (XZ plane) at an angle 2θb with respect to the optical axis direction Y. It is thus possible according to the second embodiment to obtain laser light having a particular wavelength corresponding to the Bragg diffraction along a different direction from the travel direction of other laser light.

The structure and the operation of the wavelength converter 34 according to this embodiment, being common to those of spatial light modulators used in exposure apparatuses which will be described later, will be discussed in detail later. Further, while the domain-inverted grating of the Bragg diffraction type is created in order to obtain laser light having the predetermined wavelength according to this embodiment, this may be changed to a domain-inverted grating of a different diffraction method such as the Raman-Nath diffraction type as that described in JP-A-2009-31732 mentioned earlier for example.

As described above, with the laser apparatus LS which uses the optical device according to the second embodiment, as the wavelength converter 34 is disposed between the wavelength conversion part 315 and the exit surface 311b, it is possible to take out, in a predetermined direction, laser light having a predetermined wavelength only from among laser light belonging to a plurality of wavelength regions from the wavelength conversion part 315. The wavelength converter 34 (the periodically poled part 316), though being additionally disposed element, is provided inside the ferroelectric crystal substrate 31 together with the wavelength conversion parts 314 and 315, and therefore, requires no highly precise optical axis alignment. Further, it is possible to prevent a temperature or humidity change from deviating the alignment of the optical axes, which stabilizes the optical performances such as the light intensity stability, the efficiency of wavelength conversion and the wavelength selectivity.

A-3. Laser Apparatus Using Optical Device of the Third Embodiment

While the second embodiment described above requires selection of a wavelength using the diffraction-type domain-inverted gratings, a wavelength-selecting coating may be used instead. That is, in the laser apparatus LS shown in FIG. 1A, the exit surface 311b may be coated with a wavelength-selecting coating formed by a dielectric multi-layer film, a metal film or the like so that it is possible to select the wavelength of the laser light L5 which the laser apparatus LS outputs.

A-4. Laser Apparatus Using Optical Device of the Forth Embodiment

The optical device 3 according to the embodiment above utilizes the quasi phase matching method in an attempt to enhance the efficiency of wavelength conversion. Hence, it is necessary to highly precisely form the polarized segments in the wavelength conversion parts 314 and 315. However, it is difficult to perfectly obviate a processing error which arises when the wavelength conversion parts 314 and 315 are being formed. A heat-controlling phase matching section may be disposed for the wavelength conversion parts 314 and 315 to thereby adjust the temperatures of the wavelength conversion parts 314 and 315 and securely match the phases. The structure and operation of the heat-controlling phase matching section according to this embodiment, being the same as those of the heat-controlling phase matching section adopted for the exposure apparatus described later, will be described in detail later.

A-5. Laser Apparatus Using Optical Device of the Fifth Embodiment

While a temperature controller adjusts the temperatures of the wavelength conversion parts for improved phase matching in the optical device according to the forth embodiment, an electrode may be disposed on the top surfaces of the wavelength conversion parts to thereby adjust an electric field to be developed between the electrode and the metal film and improve phase matching. The structure and operation of the field adjustment adopted in this embodiment, being the same as those of the field adjustment adopted for the exposure apparatus described later, will be described in detail later.

B. Exposure Apparatus Using Optical Device of the Invention

B-1. Exposure Apparatus Using Optical Device of the Sixth Embodiment

Figure 3:
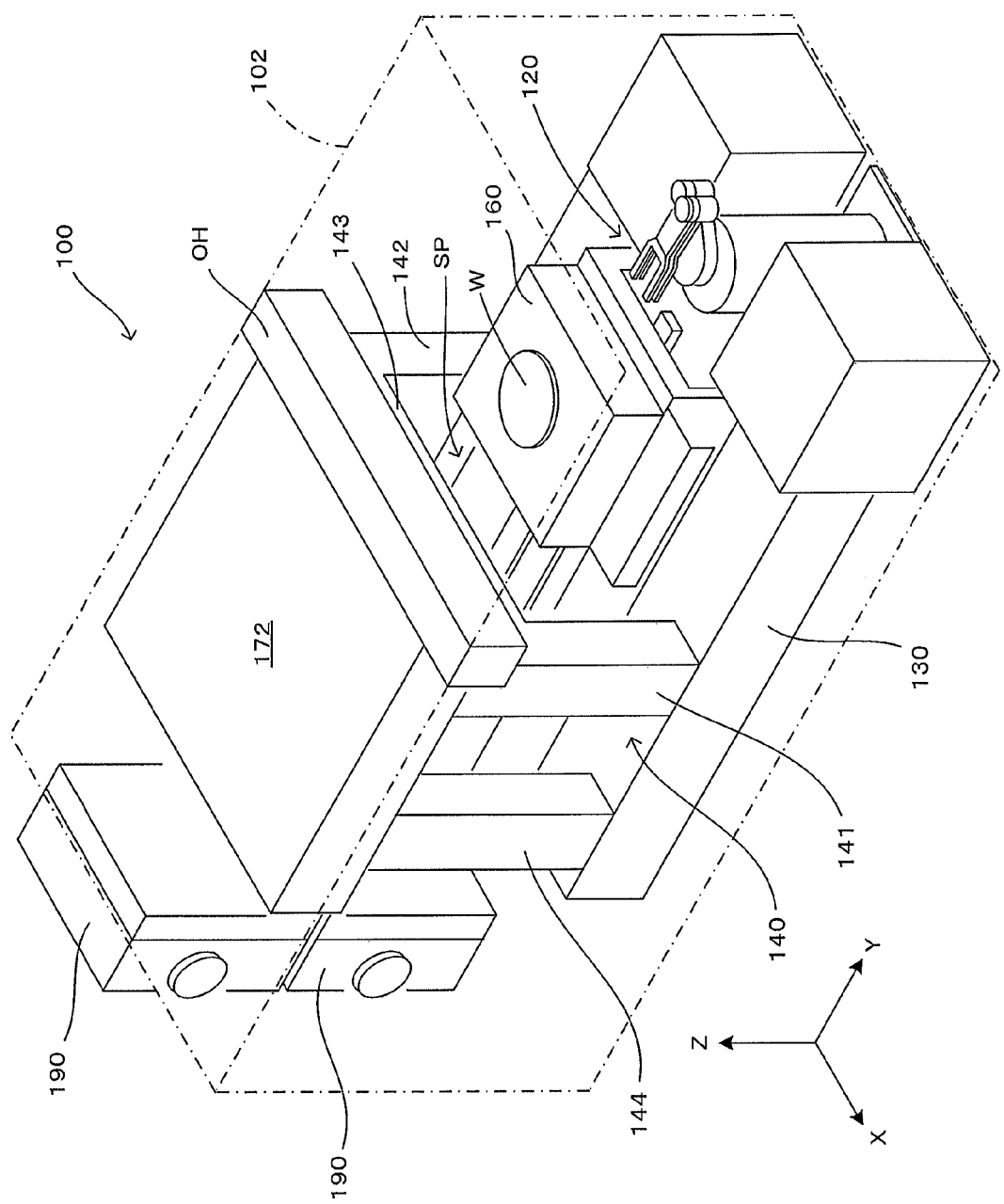
FIG. 3 is a perspective view of a pattern drawing apparatus equipped with the exposure apparatus which uses the optical device according to the sixth embodiment of the invention.
Figure 4:
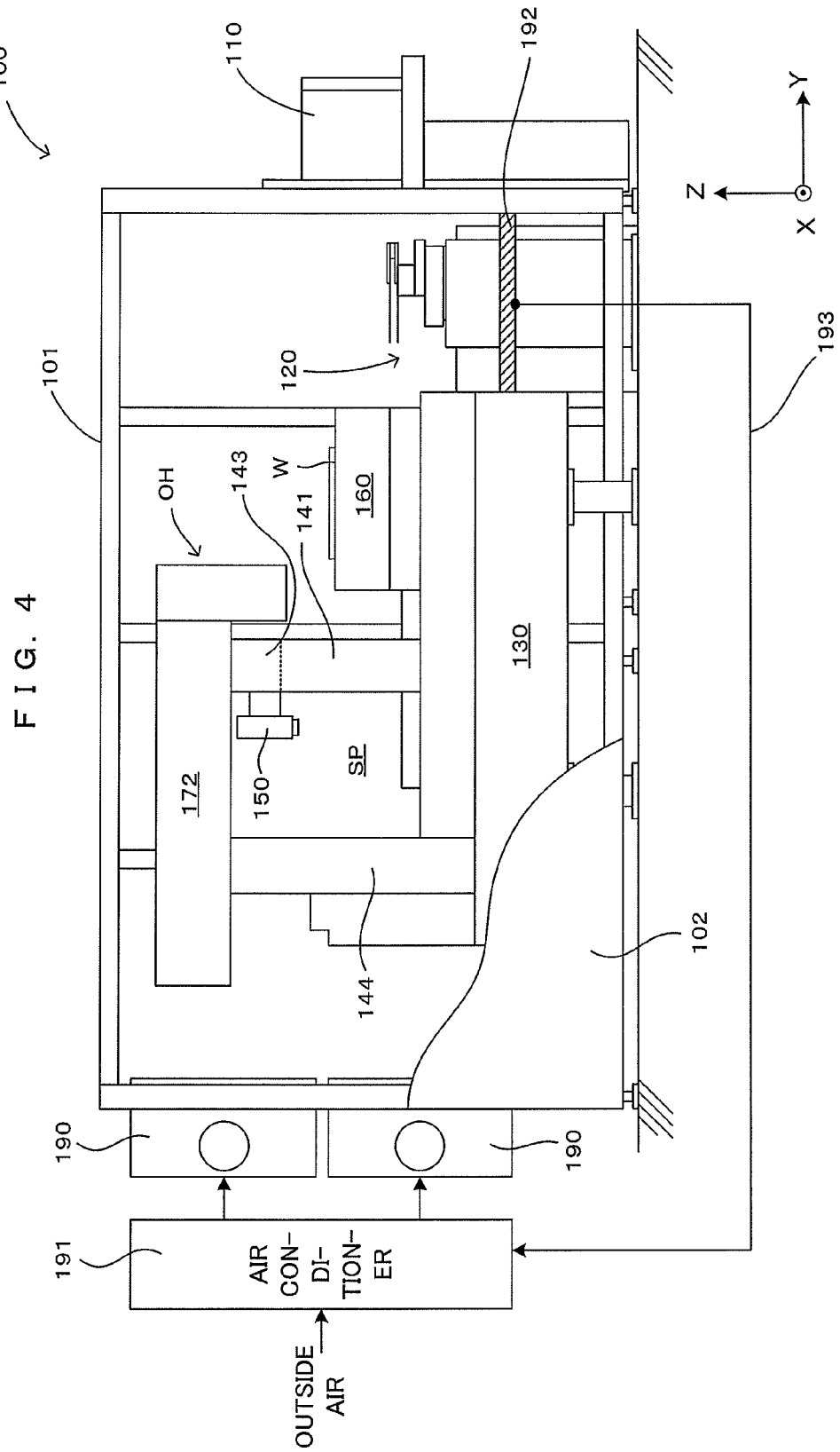
FIG. 4 is a side view of the pattern drawing apparatus shown in FIG. 3.

FIG. 3 is a perspective view of a pattern drawing apparatus equipped with the exposure apparatus which uses the optical device according to the sixth embodiment of the invention, FIG. 4 is a side view of the pattern drawing apparatus shown in FIG. 3, and FIG. 5 is a part diagram which shows the electric structure of the pattern drawing apparatus. This pattern drawing apparatus 100 is an apparatus which irradiates light upon the surface of the substrate W, such as a semiconductor substrate or a glass substrate whose surface has been applied with a photosensitive material, and accordingly draws a pattern.

In the pattern drawing apparatus 100, covers 102 are attached to a main unit frame 101 so as to form a main unit. The respective parts of the apparatus are disposed inside the main unit, thus forming a main unit part. A substrate storage cassette 110 is disposed outside the main unit part (i.e., on the right-hand side to the main unit part according to this embodiment as shown in FIG. 4). A substrate W to be exposed, that is the unprocessed substrate W, is stored within the substrate storage cassette 110, and a transportation robot 120 disposed inside the main unit loads the unprocessed substrate W into the main unit. After the exposure processing (pattern drawing processing) of the substrate W, the transportation robot 120 unloads the substrate W from the main unit and returns the substrate W back into the substrate storage cassette 110.

In the main unit, the transportation robot 120 is disposed at the far-right end inside the main unit covered with the cover 102 as shown in FIGS. 3 and 4. Disposed on the left-hand side to the transportation robot 120 is a base 130. An area at one end of the base 130 (the right-hand side area in FIGS. 3 and 4) serves as a substrate transfer area for transfer of the substrate W with the transportation robot 120, whereas an area at the other end (the left-hand side area in FIGS. 3 and 4) serves as a pattern drawing area for drawing a pattern on the substrate W. On the base 130, a head support 140 is located at a position on the border between the substrate transfer area and the pattern drawing area. In the head support 140, two legs 141 and 142 extend upright from the base 130 toward above, and a beam 143 traverses from the apex of the leg 141 to that of the leg 142. Further, as shown in FIG. 4, a camera (imaging device) 150 is fixed to the side surface of the beam 143 facing the pattern drawing area and shoots the surface of the substrate W (the drawing surface, the surface-to-be-exposed) which is held by the stage 160.

A stage moving mechanism 161 moves the stage 160 in the direction X, the direction Y and the direction θ on the base 130. That is, the stage moving mechanism 161 is formed as a Y-axis driver 161Y (FIG. 5), an X-axis driver 161X (FIG. 5) and a θ-axis driver 161T (FIG. 5) are stacked one atop the other on the top surface of the base 130, and two-dimensionally moves and fixes the stage 160 within the horizontal plane. Further, the stage moving mechanism 161 rotates the stage 160 about the θ-axis (the vertical axis), thereby adjusting the angle of the stage 160 relative to an optical head OH which will be described later and positioning the stage 160. A known X-Y-θ-axis moving mechanism which has been widely used may be used as the stage moving mechanism 161.

The optical head OH is fixed to a box 172 on the pattern drawing area side to the head support 140. The optical head OH uses the optical device according to the invention, irradiates the substrate W with light and consequently exposes the substrate W. The optical head OH corresponds to "the exposure apparatus" of the invention. The structure and operation of the optical head will be described in detail later.

At the opposite end of the base 130 to the substrate transfer area (at the far-left end in FIGS. 3 and 4) as well, there are two legs 144 which extend upright. The box 172 partially housing the optical head OH is disposed such that the box 172 bridges the beam 143 and the apices of the two legs 144, covering from above the pattern drawing area of the base 130. This secures a space SP in which the pattern drawing area will be protected against downward flows if any intruding into inside the main unit after supplied into the clean room where the pattern drawing apparatus 100 is installed.

In the pattern drawing apparatus 100 according to this embodiment, air blowers 190, which blow temperature-adjusted air toward the space SP which is located between the stage 160 and the box 172 of the optical head OH, are disposed on the opposite side of the transport robot to the space SP. According to this embodiment, the two air blowers 190 are provided, one above and the other below, so as to penetrate the cover 102 which forms the left-hand side wall of the main unit part. The air blowers 190, being connected to an air conditioner 191, operate in accordance with a command given from an exposure controller 181 and blow out air, which has been adjusted as for the temperature by the air conditioner 191, toward the space SP. A temperature-controlled gas blown out from the air blowers 190 flows sidewise and moves passed the space SP. This entirely refreshes the atmosphere within the space SP and suppresses a change of the temperature in the pattern drawing area. While the air, which has thus moved and passed the space SP, then flows to the transportation robot 120, a discharge outlet 192 is provided below the transportation robot 120 and connected to the air conditioner 191 through a pipe 193. The existence of the discharge outlet 192 expels the atmosphere surrounding the transportation robot 120, whereby air flows toward below, namely, downward flows are created in the atmosphere surrounding the transportation robot 120. This effectively prevents the transportation robot 120 from blowing up and scattering particles.

The structure and operation of the optical head (exposure apparatus) OH will now be described. According to this embodiment, the optical head OH is fixed to the box 172, and as the optical head OH irradiates light down upon the substrate W which is in motion immediately below the optical head OH, the substrate W held by the stage 160 is exposed and a pattern is drawn on the substrate W. It is possible according to this embodiment to irradiate light simultaneously over a plurality of channels in the direction X, and the direction X corresponds to "the secondary scanning direction." It is further possible to draw a two-dimensional pattern on the substrate W as the stage 160 moves in the direction Y, and the direction Y corresponds to "the primary scanning direction."

Figure 7A:
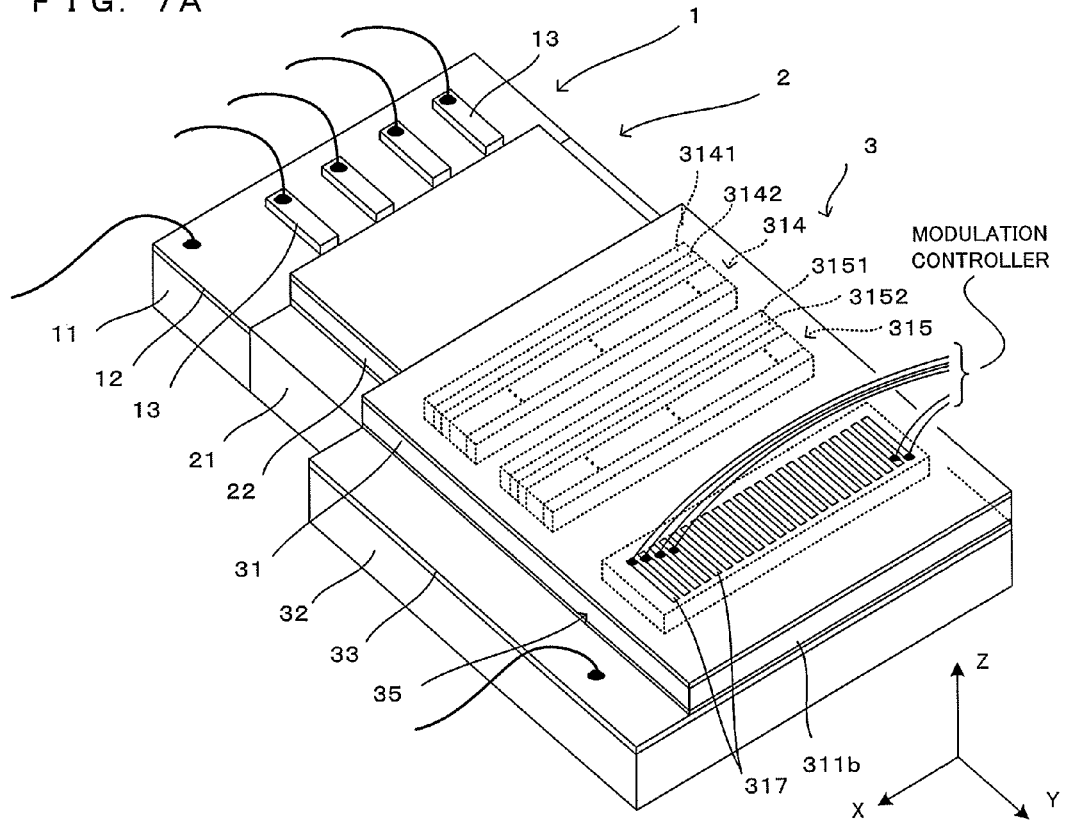
FIGS. 7A and 7B are perspective views which partially show the structure of the optical head OH.
Figure 7B:
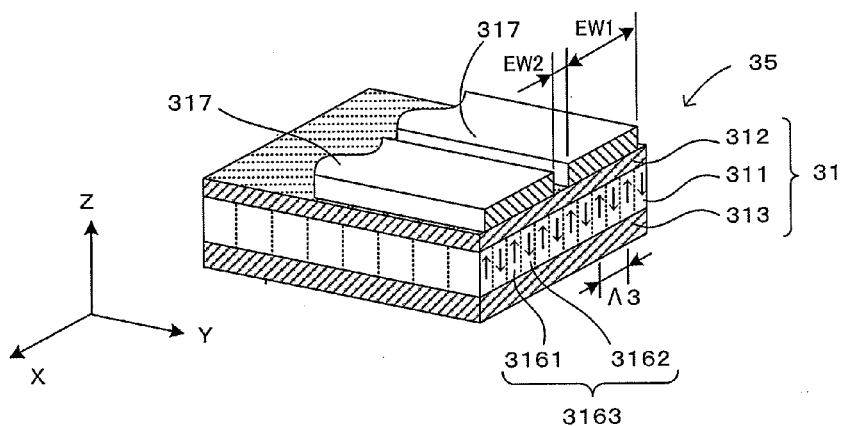

FIGS. 6A and 6B are simplified drawings which show the structure inside the optical head. FIG. 6A shows the internal structure of the optical head OH as it is viewed from above (i.e., from the (+Z)-side in FIG. 3) along the optical axis OA of the optical head OH and the secondary scanning direction X. FIG. 6B shows the internal structure of the optical head OH as it is viewed from the front of the apparatus shown in FIG. 3 (i.e., from left below) along the primary scanning direction Y (i.e., as it is viewed from the (+X)-side toward the (−X)-side of the optical head OH). FIGS. 7A and 7B are perspective views which partially show the structure of the optical head OH. FIGS. 8A and 8B are partially expanded schematic views of the spatial light modulator.

The optical head OH shown in FIGS. 6A and 6B comprises an pump light source 1 which is controlled by a light source controller 14, a solid state laser section 2, an optical device 3 which converts a wavelength of laser light L2 belonging to the near infrared region (the wavelength of 1064 nm) from the solid state laser section 2 over two steps and accordingly converts this laser light, while modulating the laser light, into laser light which belongs to the ultraviolet region (the wavelength of 355 nm), and an optical system 4 which guides the modulated light from the optical device 3 onto the surface of the substrate W. Of these elements, the pump light source 1 and the solid state laser section 2 are the same as those used in the laser apparatus LS and correspond to "the light source" of the invention. Further, the optical device 3 corresponds to the optical device according to the sixth embodiment of the invention. The structures of the pump light source 1 and the solid state laser section 2 are the same as those according to the first embodiment, and therefore will not be described but will simply be denoted at the same reference symbols.

In the optical device 3, as shown in FIGS. 6B and 7A, a metal film 33 is disposed covering a top surface of a support substrate 32 entirely and functions as a common electrode 331 as described below. Further, a ferroelectric crystal substrate 31 formed by a ferroelectric crystal is provided on the metal film 33, and is bonded and integrated with the support substrate 32 by the metal film 33. The ferroelectric crystal substrate 31 comprises an MgO:SLT crystal and silicon oxide films 312 and 313 which are formed on the top and the bottom surfaces of the crystal, so as to form a slab waveguide of the step-index type inside the crystal. Like the optical devices 3 according to the first through the fifth embodiments, wavelength conversion parts 314 and 315 having periodically poled structures, which are different from each other, are formed in the ferroelectric crystal substrate 31. Meanwhile, a spatial light modulator 35 is additionally disposed on an output side of a wavelength conversion part 315 in the optical device 3 according to the sixth embodiment.

The spatial light modulator 35 comprises a periodically poled part 316 that is disposed between the wavelength conversion part 315 and an exit surface 311b. At positions above the periodically poled part 316, a plurality of electrodes 317 are disposed such that the periodically poled part 316 lies between the electrodes 317 and the metal film 33. According to this embodiment, the metal film 33 is disposed facing the plurality of electrodes 317, and serves as the common electrode 331 which is for forming a diffraction grating in the periodically poled part 316 which has the structure described above. The electrodes 317 thus correspond to "the first electrodes" of the invention.

In the periodically poled part 316, first polarized segments 3161 and second polarized segments 3162 are alternately disposed which are polarized in opposite directions to each other. It is to be particularly noted that according to this embodiment, as shown in FIGS. 8A and 8B, the first polarized segments 3161 and the second polarized segments 3162 are all shaped as stripes which extend in a direction WD which is orthogonal to the direction of arrangement AD, and polarized pairs 3163 each consisting of the first polarized segment 3161 and the second polarized segment 3162 which have the same width along the direction of arrangement AD and are adjacent to each other are arranged along the direction of arrangement AD periodically in a predetermined period (which is a grating period Λ3 taken along XZ cross section). Thus, the spatial light modulator 35 of the ferroelectric crystal substrate 31 has which is known as a periodically poled structure. The inclination is at the angle of θb with respect to the direction Y in which the laser light propagates according to this embodiment.

Further, in the periodically poled part 316, the crystallographic axes of the first polarized segments 3161 and the second polarized segments 3162 have opposite directions to each other. As described immediately below, the directions of polarization under the applied electric field become opposite to each other.

Further, while the crystallographic axial orientation of the first polarized segments 3161 and that of the second polarized segments 3162 are opposite to each other, this is achieved as the axial orientation of the crystal, whose crystallographic orientation is originally uniform, is partially (periodically) inversed by temporarily applying the polarization voltage inherent in the crystal upon (periodic) sections which correspond to the second polarized segments of the crystal or by otherwise appropriate method. Thus processed crystal is used. Therefore, in this embodiment, the first polarized segments 3161 have the original axial orientation of the crystal, whereas the second polarized segments have the axial orientation which has been processed by polarization.

According to this embodiment, as shown in FIGS. 7A and 8A, the plurality of electrodes 317 (FIG. 8A shows only five electrodes.) are all shaped as slabs which extend along the parallel direction to the direction Y in which laser light L4 from the wavelength conversion part 315 propagates. And the electrode width EW1 along the width direction X, which is approximately orthogonal to the propagation direction Y of the laser light L4, is approximately triple the grating period Λ3. The electrodes 317 having such a shape are arranged on the top surface of the ferroelectric crystal substrate 31 at positions above the periodically poled part 316 at shorter intervals EW2 than the grating period Λ3 along the direction X. The bottom surface of the ferroelectric crystal substrate 31 is covered entirely with the common electrode 331 which serves as the common electrode for the plurality of electrodes 317.

In the wavelength conversion part 35 which have the structure described above, the common electrode 331 is grounded, whereas the plurality of electrodes 317 are connected with a modulation controller 36 and are applied with an electric potential received from the modulation controller 36 independently of each other in response to an operation command from the exposure controller 181. Therefore, inside the periodically poled part 316, only at such segments which correspond to the electrodes 317 applied with a predetermined electric potential V1 (which is an electric potential other than 0 V) from the modulation controller 36, the electric field developing between the electrodes 317 and the common electrode 331 changes the refractive index in accordance with the orientation of polarization, whereby a diffraction grating is created. Further, according to this embodiment, the angle θb is set so as to satisfy a condition under which thus formed diffraction grating gives rise to Bragg diffraction at the wavelength (355 nm) which is for the exposure processing. Hence, as shown in FIG. 8 for instance, as the electric voltage V1 is applied to only one of the five electrodes 317 (2ch) which corresponds to a second channel, the changed refractive index forms the diffraction grating only at those segments inside the periodically poled structure which correspond to the electrodes 317 (2ch), only a light beam from among the laser light L4 which is at the wavelength (355 nm) propagating between the electrodes 317 (2ch) and the common electrode 331 is Bragg-diffracted and exits the spatial light modulator 35 as Bragg-diffracted light BL as it is inclined at an angle (2θb) with respect to the direction Y within the horizontal plane (XY plane). In the event that an electric voltage difference between the electrodes 317 and the common electrode 331 is zero without any voltage application and no electric field has therefore been formed, the distribution of the refractive index is uniform between the electrodes 317 and 331 and no diffraction grating is formed. In this situation, the light beam propagates straight inside the slab waveguide of the ferroelectric crystal substrate 31 and exits the optical device 3 as zeroth-order light L0. As application of the electric voltage to each electrode 317 is thus controlled, it is possible to modulate the light in as many variations as the number of the electrodes 317.

Referring back to FIGS. 6A and 6B, the structure of the optical head OH will be described continuously. The projection optical system 4 is disposed on the output side of the optical device 3 (i.e., on the right-hand side in FIGS. 6A and 6B). In the projection optical system 4, a band pass filter 41, a cylindrical lens 42 and a schlieren optical system 43 are disposed in this order along the direction Y. The band pass filter 41 transmits only laser light which is at the wavelength of 355 nm. Hence, the cylindrical lens 42 receives only laser light which is at 355 nm from among light at a plurality of wavelengths (of 1064 nm, 532 nm and 355 nm in this embodiment) exiting the exit surface 311b of the optical device 3. The cylindrical lens 42 has a positive converging function which is positive only in the direction Z, and therefore, the zeroth-order light L0 or the diffracted light BL transmitted by the band pass filter 41 is shaped into parallel light by the cylindrical lens 42 and allowed to impinge upon the schlieren optical system 43 as shown in FIG. 6B.

In the schlieren optical system 43, a lens 431, an aperture plate 432 which has an aperture 4321, and a lens 433 are disposed in this order along the direction Y. The front focal point of the lens 431 is located at a position which is in the vicinity of the (+Y)-side end of the electrodes 317 inside the spatial light modulator 35. The aperture plate 432 is arranged such that its aperture 4321 is located at the rear focus of the lens 431. Hence, the zeroth-order light L0 at the wavelength of 355 nm transmitted by the band pass filter 41 and the lens 42 without getting diffracted inside the spatial light modulator 35 is condensed upon the aperture 4321 via the lens 431 and allowed to impinge upon the lens 433 after propagating through the aperture 4321 as denoted at the solid line in FIG. 6A. The lens 433 is arranged such that its front focal point is located near the aperture 4321 and its rear focus is located on the surface of the substrate W which is held by the stage 160. The zeroth-order light L0 is irradiated upon the surface of the substrate W via the lens 433 and exposes the surface of the substrate W. Meanwhile, the diffracted light BL leaves, as it is inclined at a predetermined angle with respect to the optical axis OA, the spatial light modulator 35 as denoted at the broken line in FIG. 6A, and therefore, is parted at a position away from the aperture 4321, i.e., by the surface of the aperture plate 432.

The schlieren optical system 43 has an equivalent arrangement to that of a both side telecentric system. Therefore, as shown in FIGS. 6A and 6B, even during exposure of the substrate W using the optical head OH which has a plurality of channels, the principal ray of the zeroth-order light L0 (denoted at the chain double-dashed lines in FIG. 6A) in each channel is perpendicular to the surface-to-be-exposed (the surface of the substrate W) and will never be subjected to a change of the magnifying power associated with a fluctuation of the surface-to-be-exposed along the focusing direction Y. This makes highly precise exposure possible. The optical head OH, which uses the optical device 3 according to the sixth embodiment, draws a pattern on the substrate W in this manner utilizing the zeroth-order light L0 which is at the wavelength of 355 nm. Further, the projection optical system 4 which is arranged as described above, thus functioning as "the optical system" of the invention, guides the light from the spatial light modulator 35 to the surface of the substrate W (the surface-to-be-exposed, the drawing surface).

The pattern drawing apparatus 100 comprises a computer 200, for the purpose of controlling the apparatus 100 as a whole. The computer 200 comprises a CPU, a memory 201, etc., and is disposed together with the exposure controller 181 inside an electronic equipment rack (not shown). Further, as the CPU inside the computer 200 performs computation in accordance with a predetermined program and functions as a rasterizer 202, an expansion/contraction ratio calculator 203, a data corrector 204 and a data generator 205. For instance, data of a pattern corresponding to one LSI are data generated by an external CAD or the like and have been prepared in advance within the memory 201 as LSI data 211, and a pattern for the LSI is drawn on the substrate W based upon the LSI data 211 in the following manner.

The rasterizer 202 divides and rasterizes a unit area denoted by the LSI data 211, and generates raster data 212 and saves the raster data 212 in the memory 201. After thus preparing the raster data 212 or concurrently with preparation of the raster data 212, the transportation robot 120 retrieves the unprocessed substrate W stored in the cassette 110 in the manner described earlier and sets the substrate unprocessed W upon the stage 160.

Following this, the stage moving mechanism 161 moves the stage 160 to immediately below the camera 150, the respective alignment marks (reference marks) on the substrate W are aligned one by one to shooting positions which the camera 150 can shoot, and the camera 150 shoots the marks. An image processing circuit (not shown in FIG. 5) which is disposed inside the electronic equipment rack processes an image signal from the camera 150, whereby the positions of the alignment marks on the stage 160 are accurately calculated. Based on the information regarding these positions, the θ-axis driver 161T operates and rotates the stage 160 about the vertical axis by an extremely small amount, thereby achieving alignment (positioning) in a proper direction to drawing of a pattern on the substrate W. The alignment may be made after moving the stage 160 to immediately under the optical head OH.

The expansion ratio calculator 203 shown in FIG. 5 fetches the positions of the alignment marks on the substrate W calculated by the image processing circuit and the amount of correction to be made to the orientation of the substrate W, and calculates the post-alignment positions of the alignment marks and the expansion/contraction ratios of the substrate W in the primary scanning direction Y and the secondary scanning direction X (namely, the expansion/contraction ratios of the major surface).

Meanwhile, the data corrector 204 fetches the raster data 212 and corrects the data based upon the expansion/contraction ratios which are the detection result of expansion/contraction. For the data correction, the method described in Japanese Patent No. 4020248 for example may be used. Upon correction of the data in one divided area, the corrected raster data 212 are sent to the data generator 205. The data generator 205 generates drawing data which correspond to the changed divided area, that is, data which correspond to one stripe.

The drawing data thus generated are sent from the data generator 205 to the exposure controller 181, and as the exposure controller 181 controls the respective parts of the light source controller 14, the modulation controller 36 and the stage moving mechanism 161, one stripe is drawn. The exposure operation is performed with the semiconductor laser 13 turned on by the light source controller 14 and the electric field controlled by the modulation controller 36. Similar processing is performed for the next divided area upon exposure/recording of one stripe, which drawing is repeated per stripe. As drawing of all stripes on the substrate W ends and drawing of desired patterns on the surface of the substrate W completes, the stage 160 moves to the substrate transfer position (the right-hand side in FIGS. 3 and 4) while carrying the substrate W whose both surfaces now have patterns, and the substrate transportation robot 120 then loads back the substrate W into the cassette 110. The next substrate W is thereafter unloaded and a series of similar processing is repeated. After completion of pattern drawing on all substrates W stored in the cassette 110, the cassette 110 is unloaded from the pattern drawing apparatus 100.

As described above, in the optical head (exposure apparatus) OH which uses the optical device according to the sixth embodiment, the spatial light modulator 35 is disposed between the wavelength conversion part 315 and the exit surface 311b and modulates the laser light from the wavelength conversion part 315. The zeroth-order light L0 at the particular wavelength (which is 355 nm according to this embodiment) alone is guided to the substrate W (recording material), and patterns corresponding to the LSI data are drawn. Further, since the spatial light modulator 35 is disposed together with the wavelength conversion parts 314 and 315 inside the ferro electric crystal substrate 31, it is not necessary to highly precisely align the optical axes between the wavelength conversion parts 314, 315 and the spatial light modulator 35. In addition, even if a temperature or humidity change is occurred, the optical head OH exposes the light without the occurrence of destroying the alignment of the optical axes. Therefore, the optical head OH ensures stability of the optical performances such as the light amount stability, the efficiency of frequency conversion and the performance of spatial light modulation.

Further, in the ferroelectric crystal substrate 31, the slab waveguide is provided which is wider in the width direction X than in the thickness direction Z, the plurality of electrodes 317 are arranged in the width direction X. And as the modulation controller 36 controls the voltage applied upon the electrodes 37 and hence the electric field which develops between each electrode 317 and the common electrode 331. Thus, the efficiency of diffraction inside the periodically poled structure is modulated for each electrode 317. It is thus possible according to this embodiment to modulate the light in as many channels as the number of the electrodes 317.

In addition, since the metal film 33 integrates the ferroelectric crystal substrate 31, comprising the two wavelength conversion parts 314 and 315 and the spatial light modulator, with the support substrate 32, excellent optical performances are ensured for a similar reason to that according to the first embodiment.

Further, since the optical head (exposure apparatus) OH is formed using the optical device 3 which exhibits these excellent optical performances, it is easy to align the optical axes inside the optical head OH and it is therefore possible to stably output the laser light which is at a proper wavelength (which is 355 nm according to this embodiment) to the exposure processing.

B-2. Exposure Apparatus Using Optical Device of the Seventh Embodiment

Figures 9A, 9B:
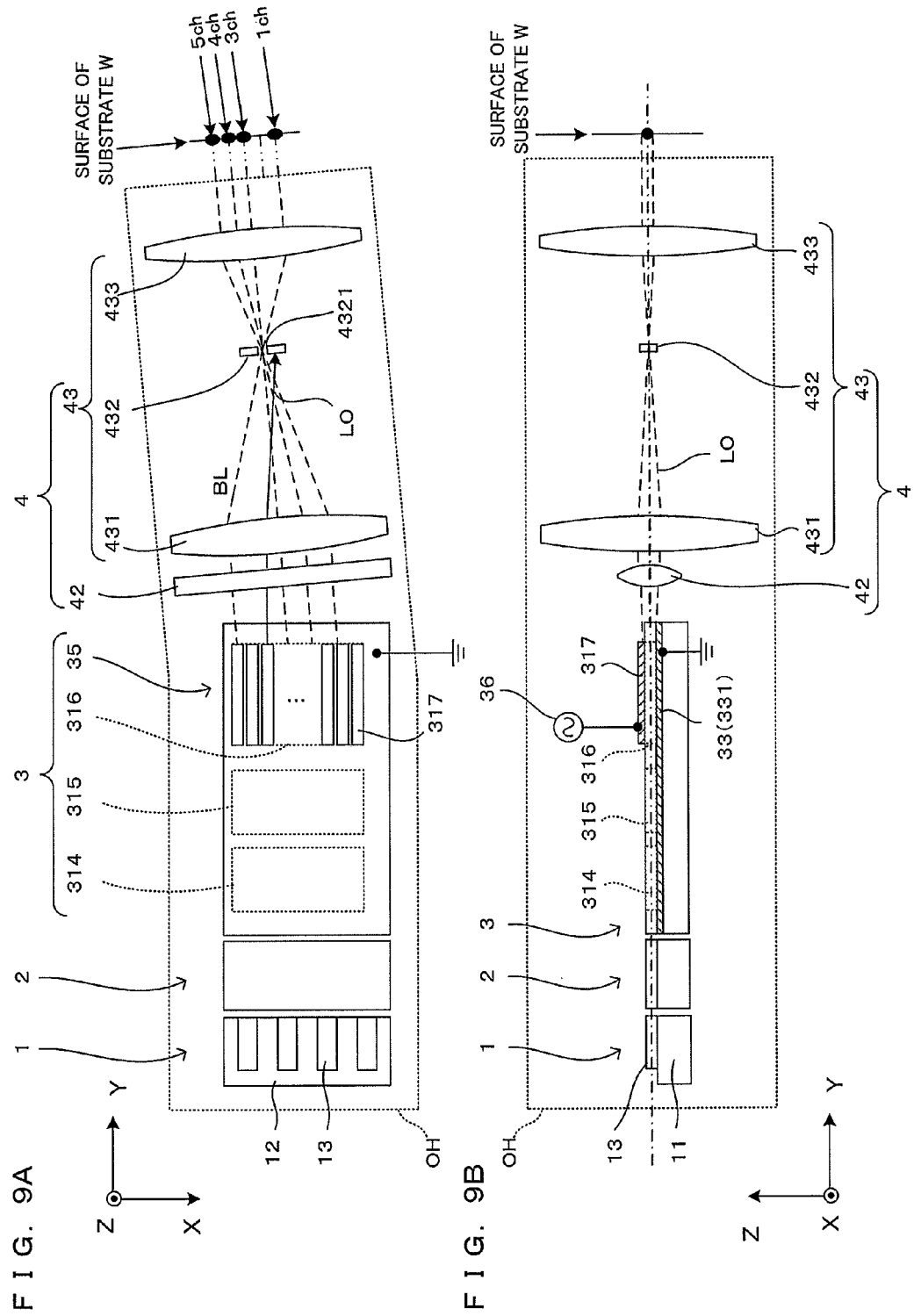
FIGS. 9A and 9B are drawings which show a pattern drawing apparatus equipped with the exposure apparatus which uses the optical device according to the seventh embodiment of the invention.

FIGS. 9A and 9B are drawings which show a pattern drawing apparatus equipped with the exposure apparatus which uses the optical device according to the seventh embodiment of the invention. The optical head (exposure apparatus) OH, which uses the optical device according to the seventh embodiment, is significantly different from the optical head which uses the zeroth-order light L0 for exposure/recording in that it draws a pattern on the surface of the substrate W using the Bragg-diffracted light BL. That is, as shown in FIGS. 9A and 9B, the seventh embodiment is characterized in that the projection optical system 4 does not comprise the band pass filter 41 but is formed by the cylindrical lens 42 and the schlieren optical system 43 and that the projection optical system 4 is disposed at the angle 2θb with respect to the direction of propagation of the incident laser light L4 (the optical axis OA on the incident side of the spatial light modulator 35) within the XY plane.

In the pattern drawing apparatus, the light Bragg-diffracted by the spatial light modulator 35 is emitted from the exit surface 311b of the ferroelectric crystal substrate 31 as denoted by the broken lines in FIG. 9A. The Bragg-diffracted light BL is reduced at the aperture 4321 via the lens 431, transmitted by the aperture 4321 and incident upon the lens 433. The lens 433 makes the Bragg-diffracted light BL irradiated upon the surface of the substrate W. When a voltage V1 is applied to first electrodes 333 in the first and the third through the fifth channels, the Bragg-diffracted light BL corresponding to these channels (1 and 3 through 5ch) is irradiated in the manner described above upon the surface of the substrate W, and the surface of the substrate W is exposed at spots in accordance with these channels (1 and 3 through 5ch). Meanwhile, the light in the channel 2, namely, the zeroth-order light L0, exiting the ferroelectric crystal substrate 31 parallel to the optical axis OA as denoted at the solid lines in FIG. 9A, is parted at a position away from the aperture 4321, that is, by the surface of the aperture plate 432.

As described above, in the seventh embodiment, the Bragg-diffracted light BL is formed as the modulation controller 36 controls the electric field developing inside the periodically poled part 316 of the spatial light modulator 35, and utilizing Bragg diffraction, the Bragg-diffracted light belonging to the ultraviolet region is made available to the exposure processing. This not only achieves a similar effect to that according to the sixth embodiment but eliminates the necessity of the band pass filter 41, and therefore, simplifies the structure of the optical head OH than in the sixth embodiment.

B-3. Exposure Apparatus Using Optical Device of the Eighth Embodiment

Figure 10A:
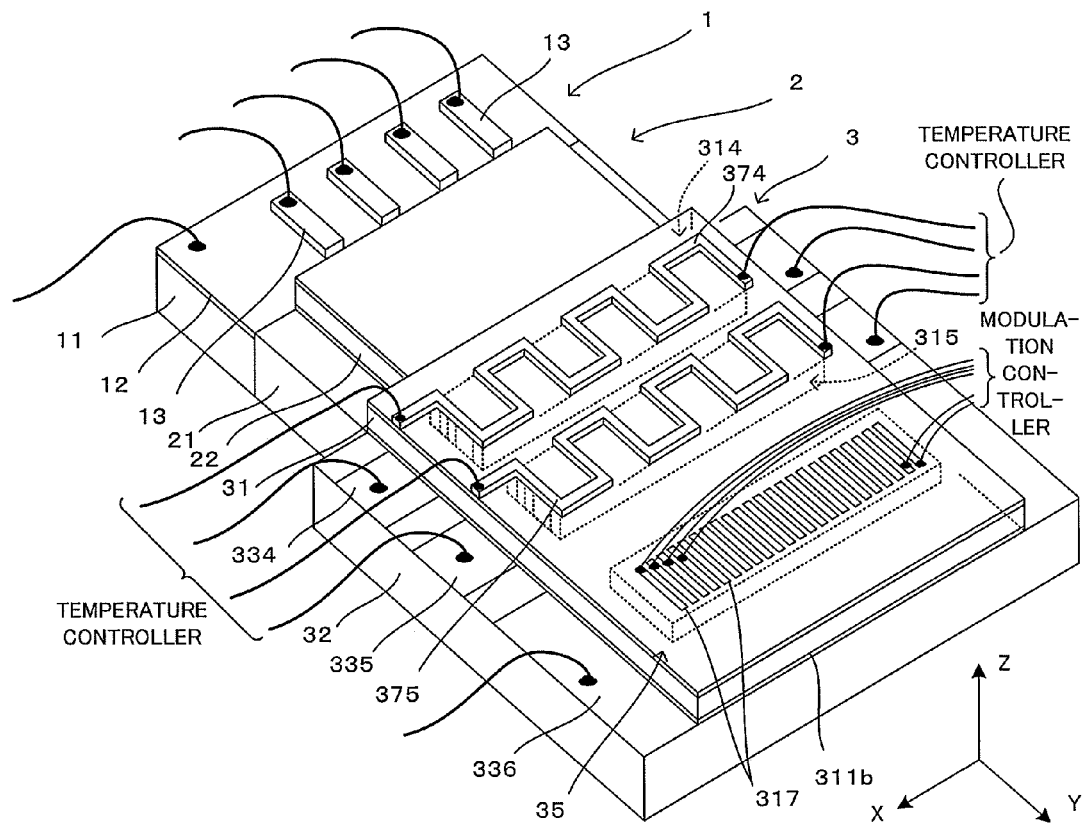
FIGS. 10A and 10B are drawings which show the optical device according to the eighth embodiment of the invention.
Figure 10B:
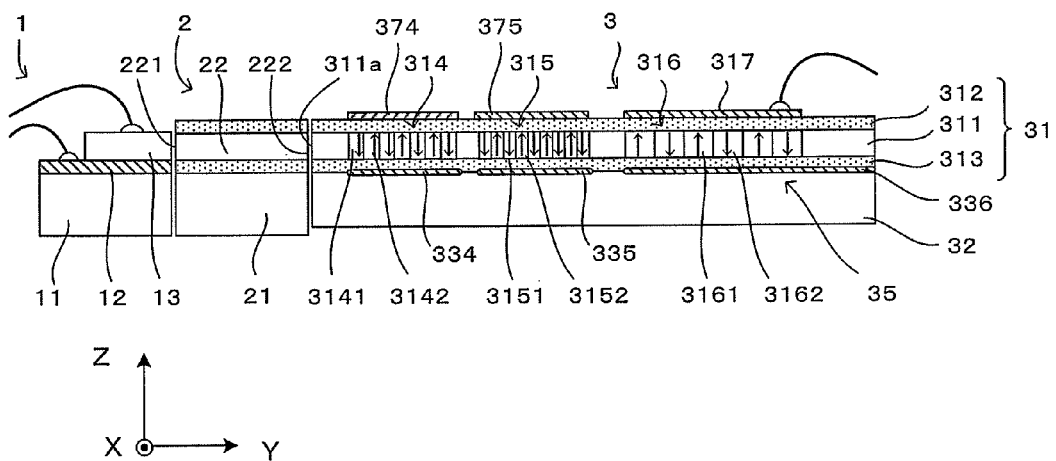

FIGS. 10A and 10B are drawings which show the optical device according to the eighth embodiment of the invention. A major difference of the eighth embodiment from the sixth embodiment is that a heat-controlling phase matching section is additionally disposed. The eighth embodiment is otherwise basically the same in structure as the sixth embodiment. The difference will therefore be described below principally.

In the eighth embodiment, three metal films 334 through 336 are disposed as the metal film 33 between the bottom surface of the ferroelectric crystal substrate 31 and the top surface of the support substrate 32, and wiring lines 374 and 375, which are shaped as square waves as viewed in a plan view respectively, are disposed at positions above the metal films 334 and 335. Describing this in more detail, the metal film 334 and the wiring line 374 are formed by a metallic material such as Tungsten (W), Titanium (Ti) and Nickel-Chromium Alloy (Ni—Cr) for example of 0.1 through 0.5 nm. The metal film 334 is disposed entirely covering the wavelength conversion part 314 from below so that the both ends of the metal film 334 extend in the form of a wing in the width direction X, and the both ends are electrically connected with the positive electrode and the negative electrode of a temperature controller (not shown). As the temperature controller provides the metal film 334 with electricity, the metal film 334 develops heat and heats up the wavelength conversion part 314 from below. In the mean time, the wiring line 374 is disposed above the wavelength conversion part 314, and the both ends of the wiring line 374 are electrically connected with the positive electrode and the negative electrode of the temperature controller. As the temperature controller provides the wiring line 374 with electricity, the wiring line 374 develops heat and heats up the wavelength conversion part 314 from above. In this embodiment, the metal film 334, the wiring line 374 and the temperature controller form the heat-controlling phase matching section which heats the wavelength conversion part 314. Hence, phase matching for wavelength conversion is made possible without fail, as the temperature of the wavelength conversion part 314 is adjusted.

A heat-controlling phase matching section is provided for the wavelength conversion part 314 as well in a similar manner to that for the wavelength conversion part 315. In short, the metal film 335 is disposed entirely covering the wavelength conversion part 315 from below, and the both ends of the metal film 335 are electrically connected with the positive electrode and the negative electrode of the temperature controller. As the temperature controller provides the metal film 335 with electricity, the metal film 335 develops heat and heats up the wavelength conversion part 315 from below. In the mean time, the wiring line 375 is disposed above the wavelength conversion part 315, and the both ends of the wiring line 375 are electrically connected with the positive electrode and the negative electrode of the temperature controller. As the temperature controller provides the wiring line 375 with electricity, the wiring line 375 develops heat and heats up the wavelength conversion part 315 from above.

As described above, in the eighth embodiment, the two wavelength conversion parts 314 and 315 and the spatial light modulator 35 are formed in the ferroelectric crystal substrate 31 and the metal films 334 through 336 integrate the ferroelectric crystal substrate 31 with the support substrate 32, and therefore, excellent optical performances are obtained as in the sixth embodiment. Further, the heat-controlling phase matching section makes it possible to adjust the temperatures of the wavelength conversion parts 314 and 315. Hence, even despite a processing error if any during manufacture of the wavelength conversion parts 314 and 315, as the heat-controlling phase matching section adjusts the temperatures of the wavelength conversion parts 314 and 315, phase matching for wavelength conversion can be realized, thereby making highly efficient wavelength conversion possible by the quasi phase matching method.

B-4. Exposure Apparatus Using Optical Device of the Ninth Embodiment

While the eighth embodiment described above utilizes temperature adjustment for phase matching for wavelength conversion at the wavelength conversion parts 314 and 315, an electric field may be applied upon each one of the wavelength conversion parts 314 and 315 to thereby change the refractive indices for phase matching as described below.

Figure 11A:
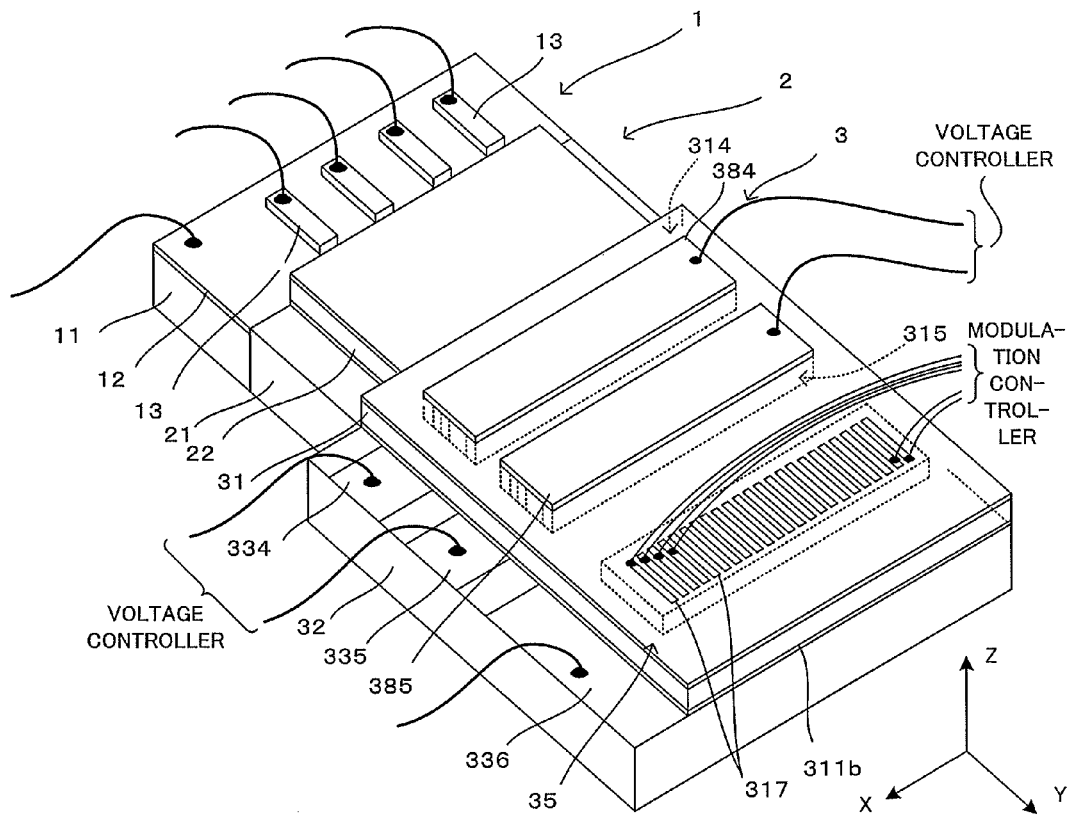
FIGS. 11A and 11B are drawings which show the optical device according to the ninth embodiment of the invention.
Figure 11B:
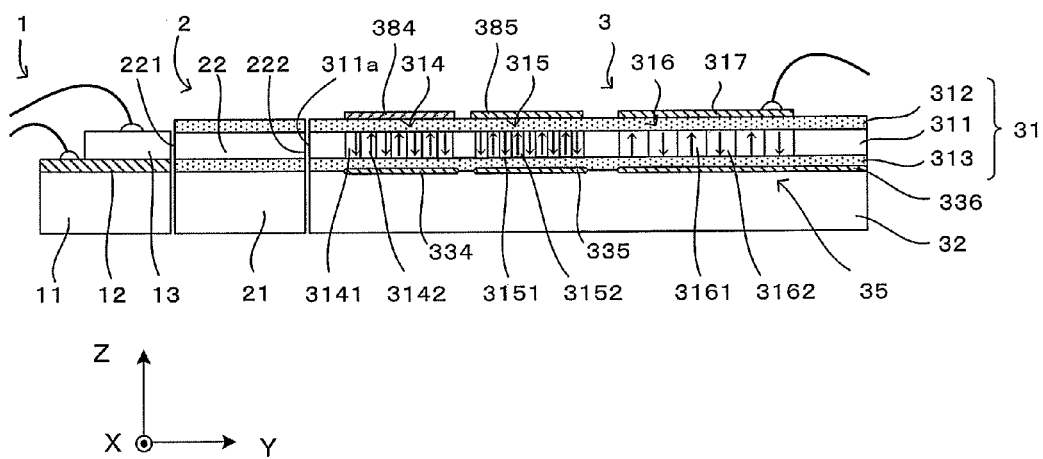

FIGS. 11A and 11B are drawings which show the optical device according to the ninth embodiment of the invention. A major difference of the ninth embodiment from the eighth embodiment is that a refraction-index-variable phase matching section is disposed instead of the heat-controlling phase matching section. The ninth embodiment is otherwise basically the same in structure as the eighth embodiment. The difference will therefore be described below principally.

In the ninth embodiment, the three metal films 334 through 336 are disposed as the metal film 33 between the bottom surface of the ferroelectric crystal substrate 31 and the top surface of the support substrate 32, and electrodes 384 and 385 which are shaped as rectangles as viewed in a plan view respectively at positions above the metal films 334 and 335. The metal film 334 is disposed entirely covering the wavelength conversion part 314 from below so that one end of the metal film 334 extends in the form of a wing in the width direction X, and this end is electrically connected with the negative electrode of a temperature controller (not shown). In the mean time, the electrode 384 is disposed entirely covering the wavelength conversion part 314 from above and is electrically connected with the positive electrode of the temperature controller. As the temperature controller controls an electric potential difference between the metal film 334 and the electrode 384, the electric field to be applied upon the wavelength conversion part 314 can be varied. In this embodiment, the metal film 334, the electrode 384 and the temperature controller form the refraction-index-variable phase matching section which changes the refractive index in the wavelength conversion part 314. Hence, phase matching for wavelength conversion is made possible without fail, as the refractive index in the wavelength conversion part 314 is adjusted.

A refraction-index-variable phase matching section is provided for the wavelength conversion part 315 as well in a similar manner to that for the wavelength conversion part 314. In short, the metal film 335 is disposed entirely covering the wavelength conversion part 315 from below, and one end of the metal film 335 is electrically connected with the negative electrode of the temperature controller. In the meantime, the electrode 385 is disposed entirely covering the wavelength conversion part 315 from above and is electrically connected with the positive electrode of the temperature controller. As the temperature controller controls an electric potential difference between the metal film 335 and the electrode 385, the electric field to be applied to the wavelength conversion part 315 can be varied. In this embodiment, the metal film 335, the electrode 385 and the temperature controller form the refraction-index-variable phase matching section which changes the refractive index in the wavelength conversion part 315.

As described above, in the ninth embodiment, the two wavelength conversion parts 314 and 315 and the spatial light modulator 35 are formed in the ferroelectric crystal substrate 31 and the metal films 334 through 336 integrate the ferroelectric crystal substrate 31 with the support substrate 32, and therefore, excellent optical performances are obtained as in the sixth embodiment. Further, the refraction-index-variable phase matching section makes it possible to adjust the refractive indices in the wavelength conversion parts 314 and 315. Hence, even despite a processing error if any during manufacture of the wavelength conversion parts 314 and 315, as the refraction-index-variable phase matching section adjusts the refractive indices in the wavelength conversion parts 314 and 315, phase matching for wavelength conversion can be realized, thereby making highly efficient wavelength conversion possible by the quasi phase matching method.

B-5. Exposure Apparatus Using Optical Device of the Tenth Embodiment

Figure 12A:
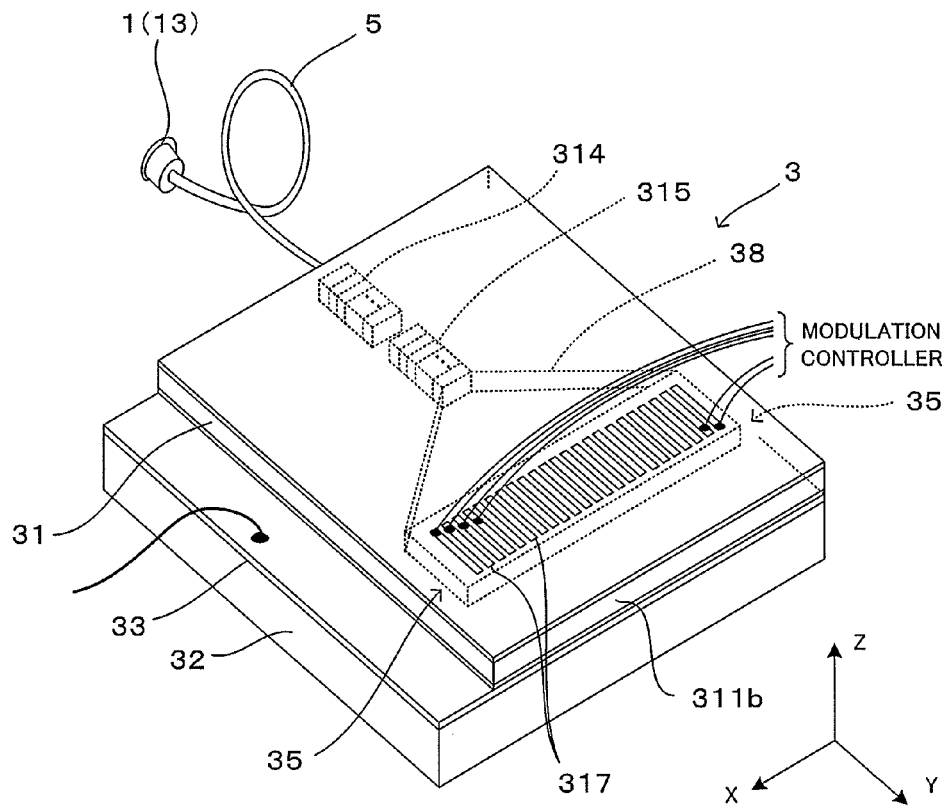
FIGS. 12A and 12B are drawings which show the optical device according to the tenth embodiment of the invention.
Figure 12B:
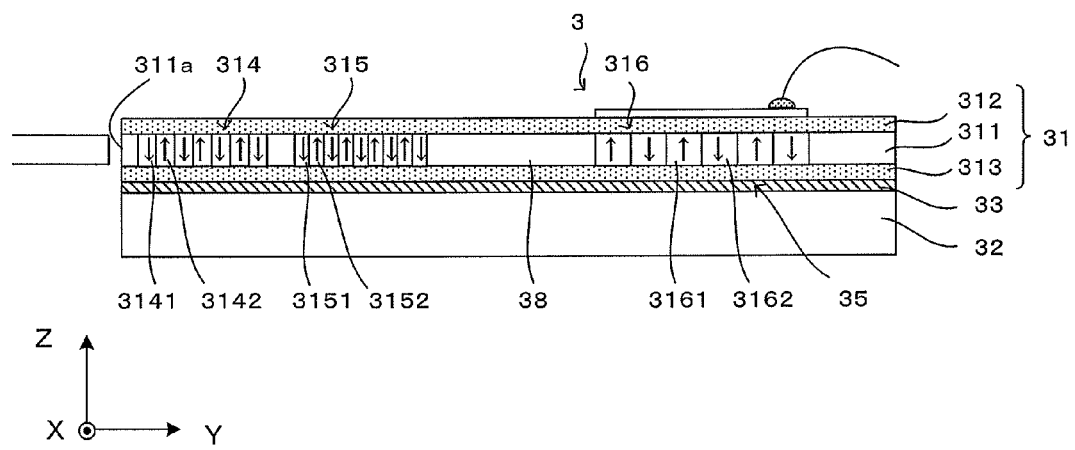

FIGS. 12A and 12B are drawings which show the optical device according to the tenth embodiment of the invention. In the tenth embodiment, the pumping light source 1 is formed by the single semiconductor laser 13, and the pump light from the semiconductor laser 13 is emitted along the optical axis direction Y and guided into an optical fiber 5. Since a core portion (not shown) of the optical fiber 5 is doped with a rare earth material and the optical fiber 5 itself serves as a laser medium, the optical fiber 5 absorbs the pump light from the semiconductor laser 13 and propagates the laser light resulting from stimulated emission in the optical axis direction Y. In this embodiment, the optical fiber 5, using fiber laser, absorbs the pump light from the semiconductor laser 13 and outputs laser light which is at 1064 nm.

The laser light emitted from the output end surface of the optical fiber 5 impinges upon the incident surface 311a of the optical device 3. An area which the laser light is incident upon is limited. Noting this, a channel waveguide, a beam shaping area and a slab waveguide are formed in the optical device 3 according to the tenth embodiment.

The optical device 3 corresponds to the optical device according to the tenth embodiment of the invention and comprises the ferroelectric crystal substrate 31 which is formed by a ferroelectric crystal, the support substrate 32 which supports the ferroelectric crystal substrate 31 from below and the metal film 33. The metal film 33 is inserted between the bottom substrate of the ferroelectric crystal substrate 31 and the top surface of the support substrate 32 and integrates the ferroelectric crystal substrate 31 with the support substrate 32 while supporting the ferroelectric crystal substrate 31 by the support substrate 32.

The ferroelectric crystal substrate 31 comprises the ferroelectric crystal 311 as in the embodiments described above. Of the both end surfaces of the ferroelectric crystal 311, the one opposed to the output end surface of the optical fiber 5 serves as the incident surface 311a, and the laser light L2 from the solid state laser element impinges upon a central area of the incident surface 311a. The wavelength conversion parts 314 and 315 are disposed in this order along the channel waveguide as in the embodiments described above. Except that the sizes taken along the width direction X are smaller than in the embodiments described above, the wavelength conversion parts 314 and 315 are the same as in the embodiments described above.

The laser light at the wavelength of 1064 nm impinging via the optical fiber 5 is then wavelength-converted over the two steps which are the wavelength conversion parts 314 and 315. That is, through the wavelength conversion processing performed by the wavelength conversion part 314, the second harmonic light (the wavelength of 532 nm)

and the light (the wavelength of 1064 nm) which has been transmitted without getting converted by the wavelength conversion part 314 are outputted to the next wavelength conversion part 315. Through the wavelength conversion processing performed by the wavelength conversion part 315, the light (the wavelength of 1064 nm) which has been transmitted without getting converted by the wavelength conversion part 314 or 315, the second harmonic light (the wavelength of 532 nm) generated at the wavelength conversion part 314 and has been transmitted without getting converted by the wavelength conversion part 315 and the third harmonic light (the wavelength of 355 nm) generated at the wavelength conversion part 315 are outputted.

Further, a beam expander 38 is disposed as an example of "the beam expansion unit" of the invention in a central portion of the ferroelectric crystal 311, i.e., between the wavelength conversion part 315 and the spatial light modulator 35. That is, as shown in FIG. 12A, the beam expander 38 is formed by a waveguide having a such shape which, when viewed from above in a plan view, widens toward the spatial light modulator 35 from the wavelength conversion part 315. Hence, the laser light from the wavelength conversion part 315 is restricted from broadening in the vertical direction Z but allowed to expand in the width direction X inside the waveguide while being guided to the spatial light modulator 35. As a result, the laser light is shaped into a flat shape as it impinges upon the spatial light modulator 35.

The spatial light modulator 35 is the same as in the embodiments described earlier: the spatial light modulator 35 performs light modulation over as many channels as the number of the electrodes 317 and emits the modulated light from the exit surface 311b of the ferroelectric crystal 311. The modulated light from the optical device 3 is guided by the projection optical system 4 onto the surface of the substrate W. The modulated light is thus irradiated upon the surface of the substrate W, which attains spot-like exposure in accordance with the respective channels.

As described above, in the tenth embodiment, the two wavelength conversion parts 314 and 315, the beam expander 38 and the spatial light modulator 35 are formed in the ferroelectric crystal substrate 31 and the metal film 33 integrates the ferroelectric crystal substrate 31 with the support substrate 32, and therefore, excellent optical performances are obtained as in the sixth embodiment.

B-6. Exposure Apparatus Using Optical Device of the Eleventh Embodiment

Figure 13A:
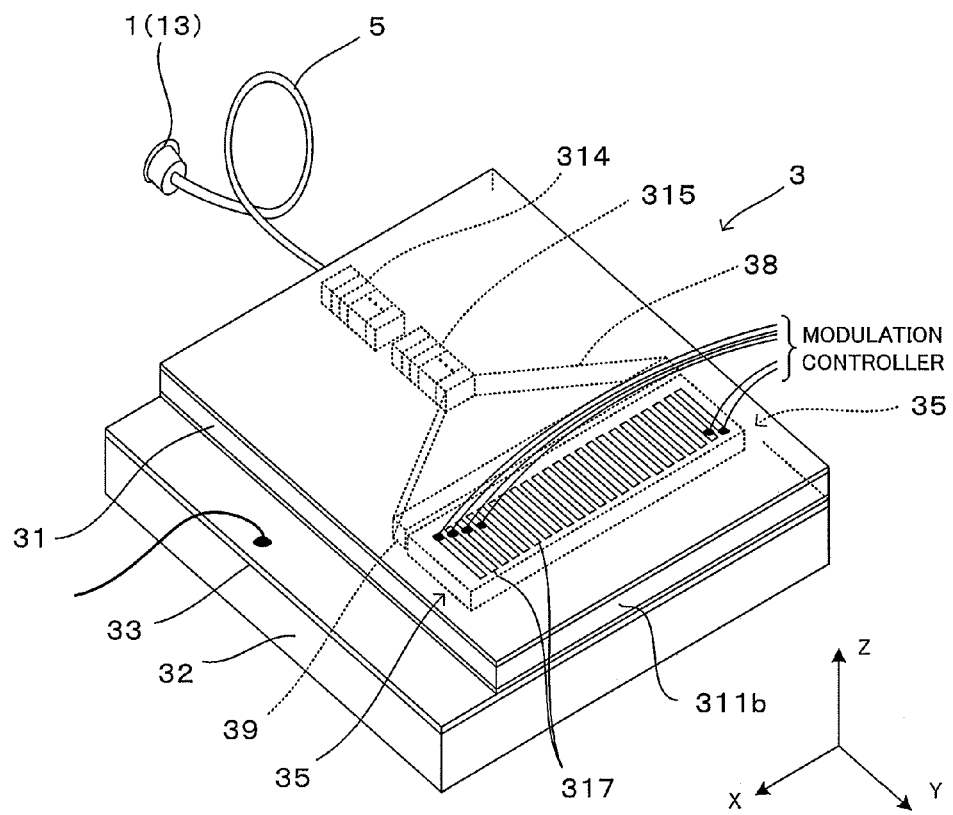
FIGS. 13A and 13B are drawings which show the optical device according to the eleventh embodiment of the invention.
Figure 13B:
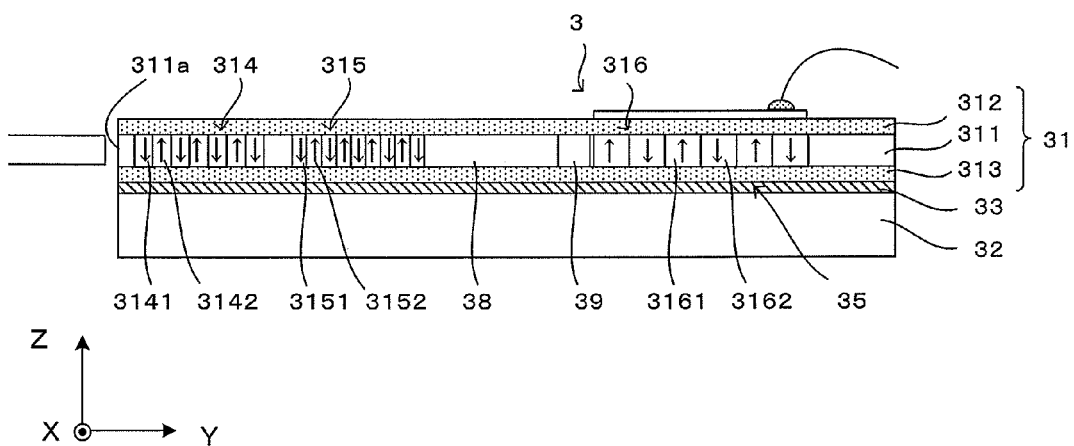

While the tenth embodiment described above requires the beam expander 38 which is disposed between the wavelength conversion part 315 and the spatial light modulator 35 as described above, a homogenizer 39 may be further disposed as an example of "the light intensity homogenization unit" of the invention between the beam expander 38 and the spatial light modulator 35 as shown for instance in FIGS. 13A and 13B (the eleventh embodiment). This makes it possible to homogenize the light intensity before the light enters the spatial light modulator 35. Of course, as the two wavelength conversion parts 314 and 315, the beam expander 38, the homogenizer 39 and the spatial light modulator 35 are formed in the ferroelectric crystal substrate 31 and the metal film 33 integrates the ferroelectric crystal substrate 31 with the support substrate 32, a similar effect to that acceding to the embodiments above is obtained. Further, the light intensity homogenization unit such as the homogenizer may be added to the sixth through the ninth embodiments. That is, the light intensity homogenization unit may be added between the wavelength conversion part 315 and the spatial light modulator 35, which also attains a similar effect.

In addition, while the beam expander 38 and the homogenizer 39 are disposed in this order according to the eleventh embodiment, the order in which they are disposed is not limited to this but may rather be the opposite. Further, a composite function part which serves both as the beam expanding function and the light intensity homogenizing function may be disposed in the ferroelectric crystal substrate 31, thus replacing the beam expander 38 and the homogenizer 39.

B-7. Exposure Apparatus Using Optical Device of the Twelfth Embodiment

By the way, while the optical device 3 and the projection optical system 4 are independent of each other in the exposure apparatus (optical head) which uses the optical device 3 according to the sixth through the eleventh embodiments described above, the projection optical system 4 may be built within the optical device 3. Further, an automatic focus function may be added by controlling the refractive indices of the lenses which are disposed inside the optical device 3. The optical device according to the twelfth embodiment will now be described with reference to FIGS. 14, 15, 16A and 16B.

Figure 14:
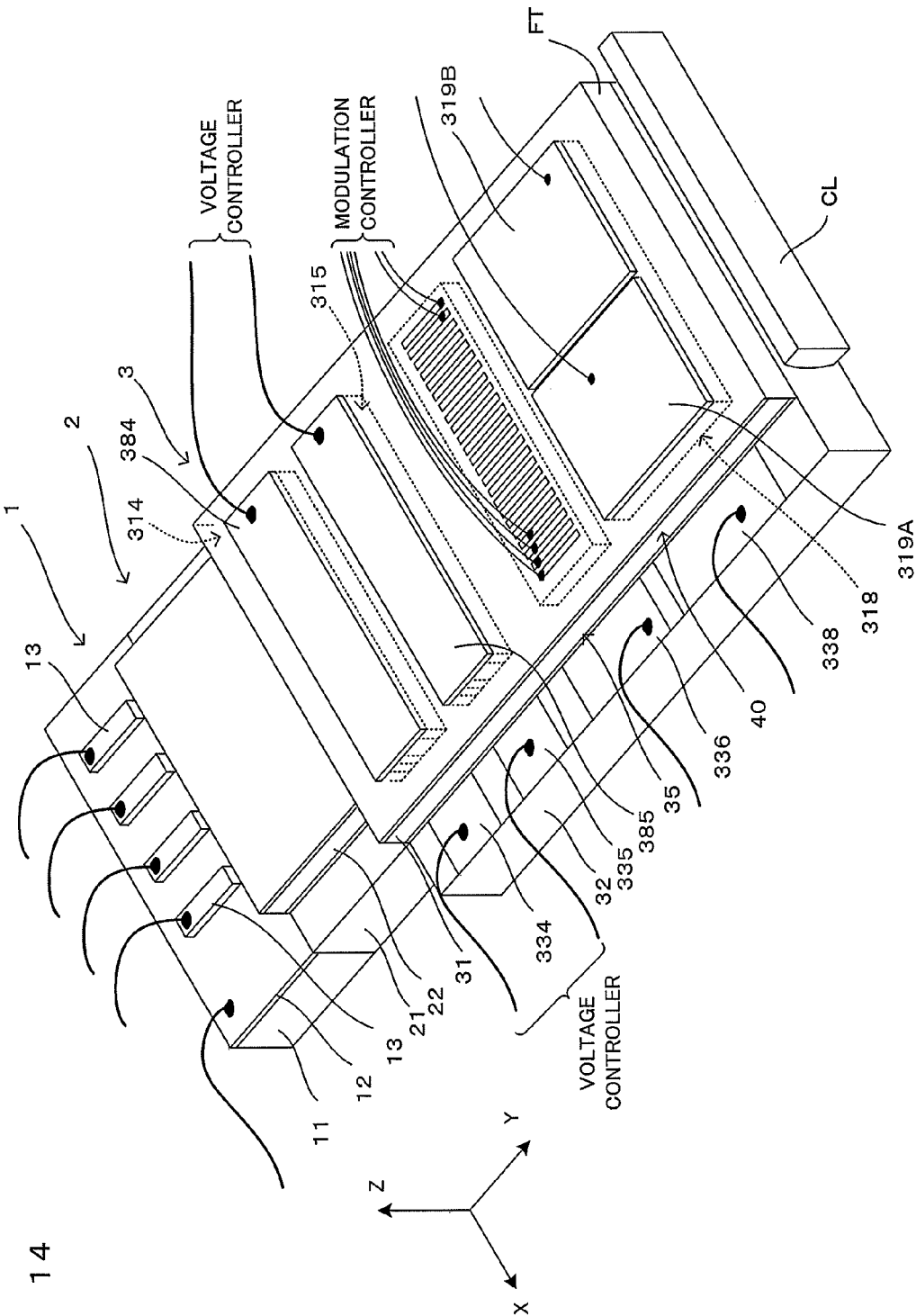
FIG. 14 is a perspective view which shows the optical device according to the twelfth embodiment of the invention.
Figure 15:
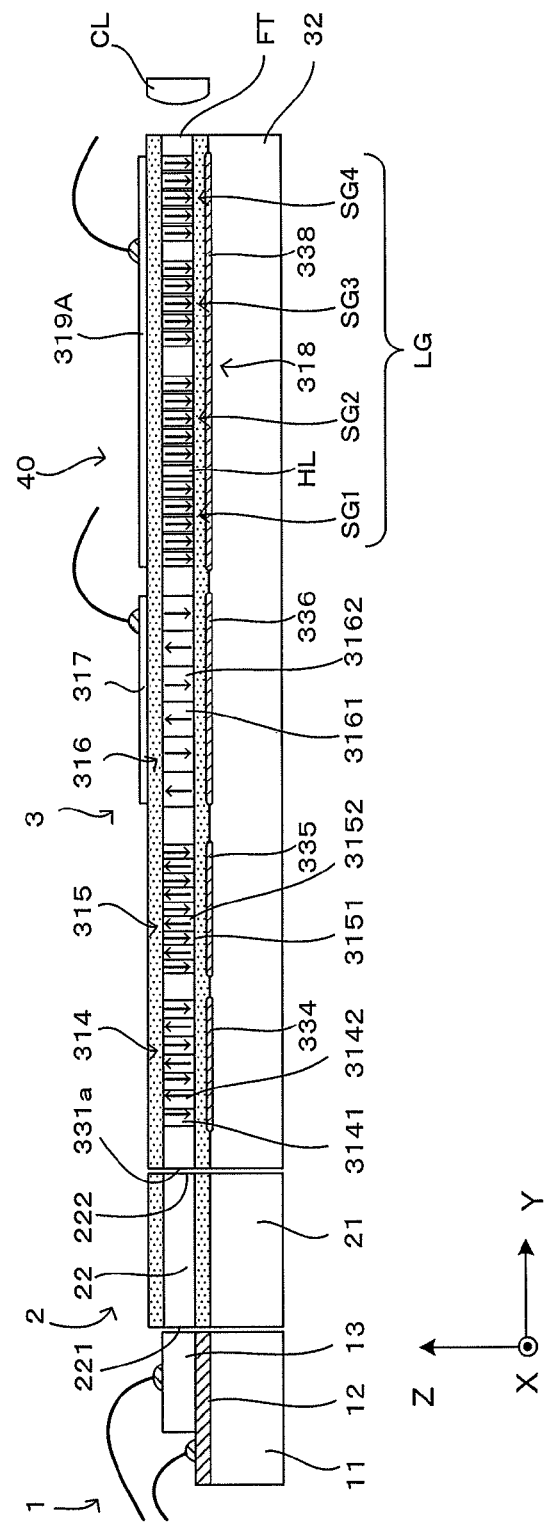
FIG. 15 is a cross sectional view of the optical device shown in FIG. 14.
Figure 16A:
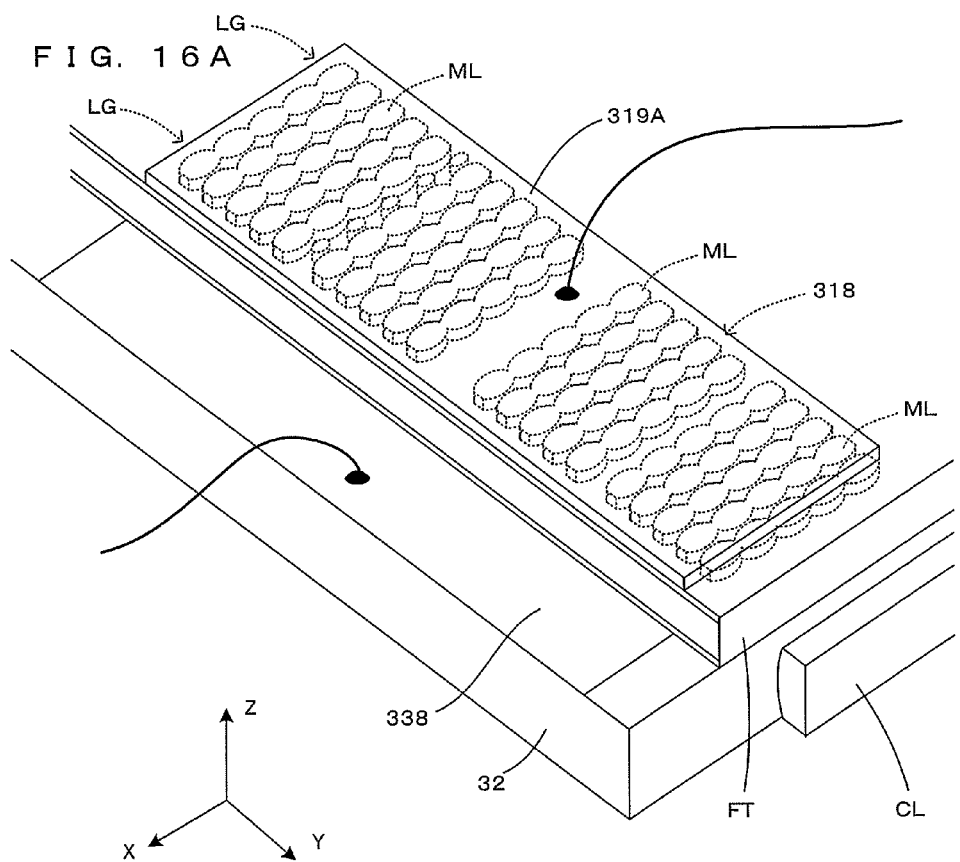
FIGS. 16A and 16B are partially enlarged views of the projection optical system which is built within the optical device of FIG. 14.
Figure 16B:
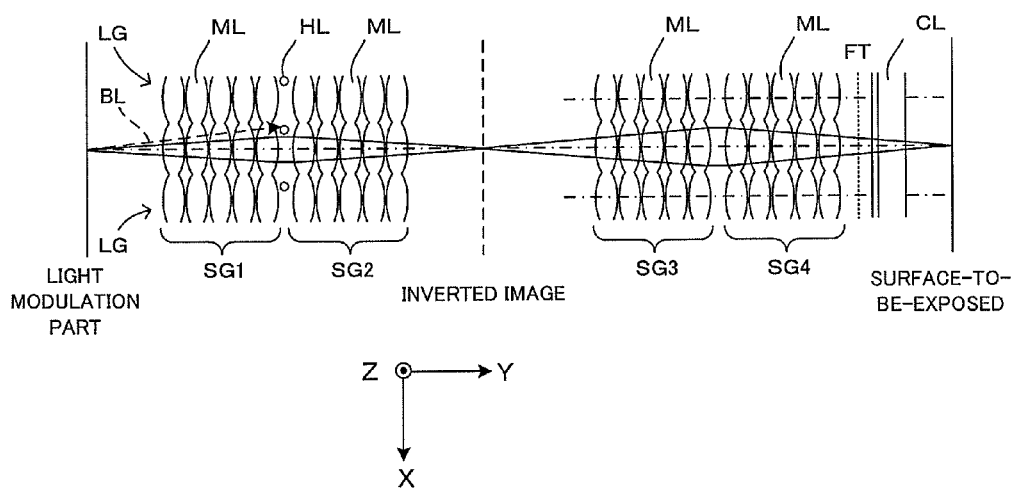

FIG. 14 is a perspective view which shows the optical device according to the twelfth embodiment of the invention. FIG. 15 is a cross sectional view of the optical device shown in FIG. 14. FIGS. 16A and 16B are partially enlarged views of the projection optical system which is built within the optical device of FIG. 14. In the twelfth embodiment, a projection optical system 40 is added into the optical device 3 according to the ninth embodiment. Hence, the structure and operation of the additionally disposed projection optical system 40 will be mainly described below, and the same structures will therefore simply be denoted at the same reference symbols but will not be described again.

In the twelfth embodiment, the projection optical system 40 is disposed inside the ferroelectric crystal 311. The projection optical system 40 is located between the spatial light modulator 35 and the exit surface 311b, and comprises a plurality of micro lenses ML which are formed by polarization reversal. In short, the projection optical system 40 has a poled part 318 in which the direction of polarization caused by an applied electric field becomes inverted between the micro lenses ML and sections surrounding the micro lenses ML. The crystallographic axial orientation of the micro lenses ML and that of the sections surrounding the micro lenses ML are opposite to each other. This is achieved as the axial orientation of the crystal, whose crystallographic orientation is originally uniform, is partially inverted by temporarily applying the polarization voltage inherent in the crystal upon sections which correspond to the second polarized segments of the crystal or by otherwise appropriate method. In this embodiment, the sections surrounding the micro lenses ML have the original crystallographic axial orientation, whereas the micro lenses ML have the polarization-inverted crystallographic axial orientation. Hence, as shown in FIG. 16B, each micro lens ML has power in the direction X which is orthogonal to the axis of crystallographic orientation (the axis Z) and converges light on the XY plane.

The micro lenses ML are arranged in a two-dimensional arrangement on the XY plane. Describing more specifically, where five micro lenses ML arranged in one line along the direction Y serve as a small lens group SG, four such small lens groups SG arranged in the direction Y define a large lens group LG. Further, such large lens groups LG are arranged in the direction X as many as the number of the channels of the spatial light modulator 35, i.e., as many as the number of the electrodes 317 in one line at the same intervals as those of the electrodes 317. For the clarity of description, of the four small lens groups SG forming one large lens group LG, the one which is the closest to the spatial light modulator 35 will be hereinafter referred to as "the first small lens group SG1," and the small lens groups SG arranged in the direction Y will be hereinafter referred to as "the second small lens group SG2," "the third small lens group SG3" and "the fourth small lens group SG4." It is however essential to the invention that the number of the large lens groups LG is the same as the number of the channels of the spatial light modulator 35. The relationship between the number of the large lens groups LG and the number of the channels of the spatial light modulator 35 may be any desired relationship.

In the projection optical system 40, the modulated light outputted in the XY plane from the spatial light modulator 35 is converged by the first small lens group SG1 and the second small lens group SG2 between the second small lens group SG2 and the third small lens group SW, whereby an inverted image is formed. The inverted image is focused on the XY plane at the surface of the substrate W (the surface-to-be-exposed, the drawing surface) by the third small lens group SG3 and the fourth small lens group SG4.

Further, as described above, each micro lens ML formed inside the ferroelectric crystal substrate 31 has power in the direction X which is orthogonal to the axis of crystallographic orientation (the axis Z) but has no power in the direction Z. Therefore, a cylindrical lens CL having power in the direction Z is disposed near the exit surface 311b of the ferroelectric crystal substrate 31 in this embodiment. In addition, a filter FT such as a wavelength selecting film is disposed to the exit surface 311b in order to make only laser light at a specified wavelength available to the exposure processing. In this embodiment, the micro lenses ML thus correspond to "the first lens" of the invention and the cylindrical lens CL thus corresponds to "the second lens" of the invention.

In this manner, laser light which is at a predetermined wavelength is converged at the surface of the substrate W and a pattern is drawn on the surface of the substrate W. According to this embodiment, extremely small holes HL are provided on the optical path of the Bragg-diffracted light BL so as to block the Bragg-diffracted light BL (denoted at the broken line in FIG. 16B). In short, the extremely small holes HL are provided between the first small lens group SG1 and the second small lens group SG2 at such positions which are away from the optical axes OA of the large lens groups LG in the direction of diffraction, as shown in FIG. 16B.

Further, in this embodiment, electrodes 319A and 319B are disposed above the projection optical system 40 so as to add to the projection optical system 40 the automatic focus function which is for adjusting the focal lengths of the micro lenses ML. A metal film 338, which is formed covering the entire top surface of the support substrate 32, and the electrodes 319A, 319B hold the poled portion 318 from the both sides. According to this embodiment, the metal film 338 is disposed opposing the electrodes 319A and 319B and electrically connected with the negative electrode of a voltage controller not shown. The metal film 338 thus functions as a common electrode which is for adjusting the refractive indices of the micro lenses ML which form the projection optical system 40.

The electrodes 319A and 319B are arranged in the direction X. The electrode 319A is located above the (+X)-side micro lenses ML, while the electrode 319B is located above the (−X)-side micro lenses ML. Further, the electrodes 319A and 319B are electrically connected with the positive electrode of the voltage controller. It is therefore possible for the voltage controller to individually control electric potentials applied to the electrodes 319A and 319B.

As the voltage controller controls electric potential differences between the electrodes 319A, 319B and the common electrode (the metal film 338), the refractive indices in the micro lenses ML are changed, thereby adjusting the position of a projected image. Each of the electrodes 319A, 319B thus correspond to "the second electrode" of the invention As described above, according to the twelfth embodiment, the two wavelength conversion parts 314 and 315, the spatial light modulator 35 and the projection optical system 40 are formed in the ferroelectric crystal substrate 31 and the metal films 334 through 336 and 338 integrate the ferroelectric crystal substrate 31 with the support substrate 32, excellent optical performances are obtained as in the sixth embodiment described above. Further, as the projection optical system 40, which has a similar function to that of the projection optical system 4, is built within the optical device 3, the size of the optical head OH is greatly reduced. In addition, since the micro lenses ML which form the projection optical system 40 are varifocal lenses and the projection optical system 40 has the automatic focus function, it is possible to securely form a projected image on the surface of the substrate W and draw a pattern in a favorable fashion.

Further, since the two electrodes 319A and 319B are provided and an automatic focus area is consequently divided into two, it is possible to individually control the amount of focus for each automatic focus area. Of course, the number, the shape and the size of the electrodes disposed above the projection optical system 40 are not limited to those according to the embodiment described above but may be set in accordance with the number of the divided automatic focus areas.

B-8. Exposure Apparatus Using Optical Device of the Thirteenth Embodiment

Figure 17A:
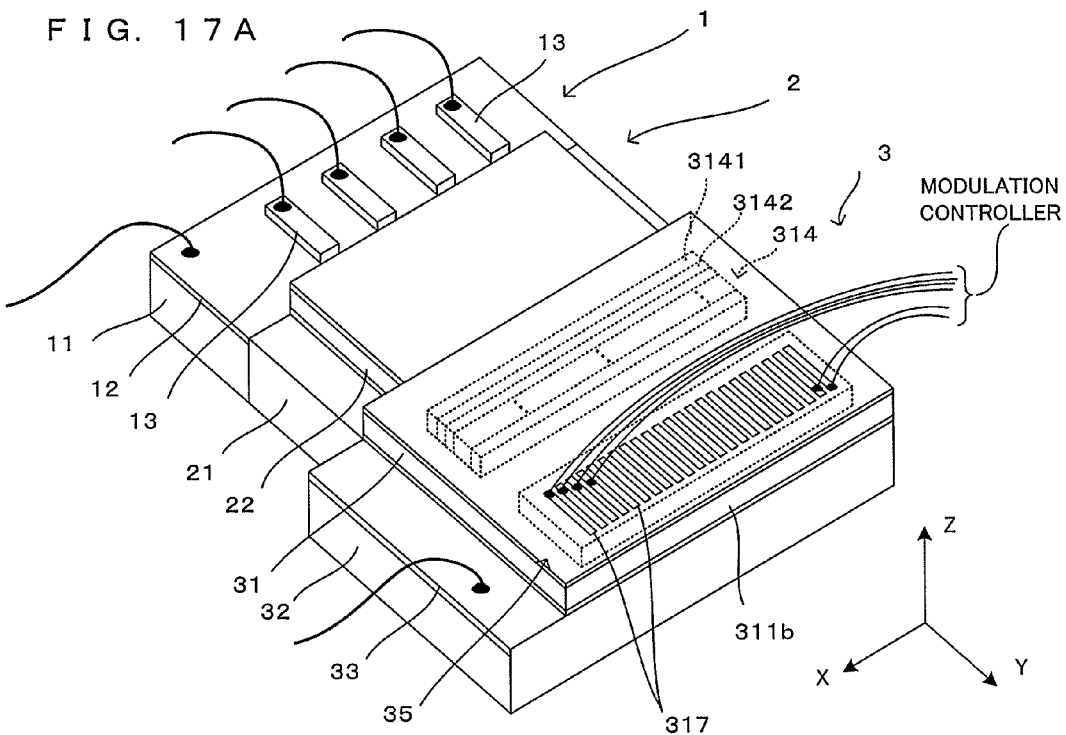
FIGS. 17A and 17B are drawings which show the optical device according to the thirteenth embodiment of the invention.
Figure 17B:
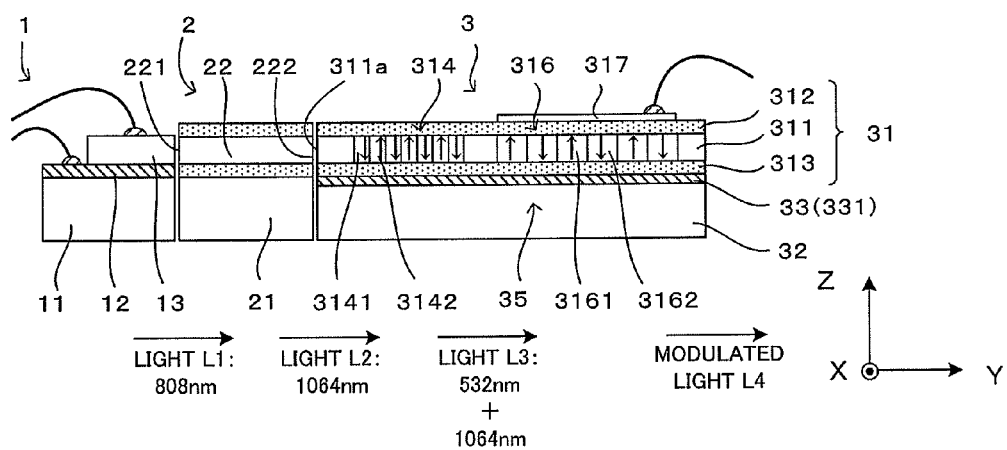

FIGS. 17A and 17B are drawings which show the optical device according to the thirteenth embodiment of the invention. The thirteenth embodiment is basically the same as the sixth embodiment (FIG. 7A), except that the second wavelength conversion part 315 is not disposed. That is, in the optical device 3, the wavelength conversion part 314 is disposed between the incident surface 311a and the exit surface 311b within the ferroelectric crystal 311 of the ferroelectric crystal substrate 31, and the light modulator 35 is disposed between the wavelength conversion part 314 and the exit surface 311b. The wavelength conversion part 314 and the light modulator 35 are the same as those according to the sixth embodiment, and the wavelength conversion part 314 serves as a second harmonic generation part and generates laser light which is at half the wavelength of the laser light L2 which is incident via the incident surface 311a, i.e., which is at 532 nm. The laser light L3 outputted from the wavelength conversion part 314 impinges upon the light modulator 35, exits the exit surface 311b after getting modulated, and as in the sixth embodiment, is guided to the surface of the substrate W via the projection optical system 4. In order to guide only the zeroth-order light L0 at 532 nm to the substrate W, the projection optical system 4 comprises the band pass filter 41 which transmits only laser light which is at the wavelength of 532 nm (FIGS. 9A and 9B) according to the thirteenth embodiment.

As described above, in the optical head (exposure apparatus) OH which uses the optical device according to the thirteenth embodiment, since the wavelength conversion part 314 and the spatial light modulator 35 are disposed, only the zeroth-order light L0 which is at the particular wavelength (532 nm in this embodiment) is guided to the substrate W (recording material) and a pattern corresponding to the LSI data is drawn. Further, since the wavelength conversion part 314 and the spatial light modulator 35 are disposed inside the ferroelectric crystal substrate 31, it is not necessary to highly precisely align the optical axes between the wavelength conversion part 314 and the spatial light modulator 35. In addition, even if a temperature or humidity change is occurred, the optical head OH exposes the light without the occurrence of destroying the alignment of the optical axes. Therefore, the optical head ensures stability of the optical performances such as the light amount stability, the efficiency of frequency conversion and the performance of spatial light modulation.

Further, owing to the structure that the ferroelectric crystal substrate 31 in which the wavelength conversion part 314 and the spatial light modulator 35 are disposed is integrated with the support substrate 32 by the metal film 33, excellent optical performances are secured for a similar reason to that according to the first embodiment.

In the thirteenth embodiment, the wavelength conversion part 314 and the spatial light modulator 35 thus correspond to "the first periodically poled part" and "the second periodically poled part" of the invention, respectively. The technical concept of replacing one of the two wavelength conversion parts with the light modulator, i.e., disposing the single wavelength conversion part and the light modulator within the same ferroelectric crystal substrate 31 is applicable also to the seventh through the twelfth embodiments, etc., attaining a similar effect to that described above.

C. Others

The invention is not limited to the embodiments described above but may be modified in various manners in addition to the embodiments above, to the extent not deviating from the object of the invention. For instance, while the embodiments above require use of MgO:SLT as the ferroelectric crystal 311, other ferroelectric crystal such as lithium niobate to which magnesium oxide (MgO) is added (MgO:Lithium Niobate) may be used instead.

Further, although the wavelength conversion part 314 serves as a second harmonic generation part and the wavelength conversion part 315 serves as a sum frequency generation part in the embodiments above, mutually different two types from among various wavelength conversion parts may be used as the wavelength conversion parts 314 and 315. For instance, a combination of the wavelength conversion parts 314 and 315 may be (a second harmonic generation part and a difference frequency generation part). Further, the number of the wavelength conversion parts is not limited to "2." One or more wavelength conversion parts which are different from the wavelength conversion parts 314 and 315 may be disposed within the ferroelectric crystal substrate 31.

Further, although the waveguide of the step-index type is formed in the ferroelectric crystal substrate 31 as a slab waveguide according to the embodiments above, a proton exchange waveguide may be formed.

Further, although $SiO_2$ is used as the insulation layers in the embodiments above, silicon nitride (SiN), transparent dielectric films of aluminum oxide ($Al_2O_3$) or the like may be used instead.

Further, while the optical head OH described above performs light modulation while making the spatial light modulator 35 give rise to Bragg diffraction, the optical head OH may be structured so as to give rise to Raman-Nath diffraction for the purpose of light modulation.

As described above, the invention makes it possible to obtain excellent optical performances, as the metal film integrates the ferroelectric crystal substrate with the support substrate and the first periodically poled part for wavelength conversion and the second periodically poled part for wavelength conversion or light modulation are disposed in the ferroelectric crystal substrate. In addition, the exposure apparatus, when formed using the optical device which has such a structure, is capable of irradiating the surface-to-be-exposed with light which is at a desired wavelength and accordingly exposing the surface-to-be-exposed. Further, when the laser apparatus is formed using the optical device which has such a structure, it is possible to stably generate laser light which is at the desired wavelength.

Further, in the optical device according to the invention, a slab waveguide for guiding incident light impinging upon the incident surface to the exit surface may be disposed inside the ferroelectric crystal substrate, and as the two-step wave conversion is performed on light propagating inside the slab waveguide, light at the desired wavelength is obtained. Further, it is possible to perform light modulation upon the light at the desired wavelength resulting from the first-step wavelength conversion.

The first periodically poled part may be disposed as a first wavelength conversion part which forms either one of a second harmonic generation part, a third harmonic generation part, a sum frequency generation part, a difference frequency generation part and an optical parametric oscillator. The second periodically poled part may be disposed as a first wavelength conversion part which forms either one of a second harmonic generation part, a third harmonic generation part, a sum frequency generation part, a difference frequency generation part and an optical parametric oscillator. In this fashion, it is possible to obtain the light having the desired wavelength through the two-step wavelength conversion. For instance, a second harmonic generation part and a sum frequency generation part may be disposed respectively as the first periodically poled part and the second periodically poled part. Alternatively, a second harmonic generation part and a difference frequency generation part may be disposed respectively as the first periodically poled part and the second periodically poled part.

Further, in the event that the two periodically poled parts are both used as the wavelength conversion parts as described above, the light modulator, the beam expansion unit such as a beam expander, the light intensity homogenization unit such as a homogenizer, or the optics unit may be additionally disposed in the ferroelectric crystal substrate to thereby make the optical device a multi-function device. Although the conventional techniques have problems that highly precise alignment of the optical axes is necessary and that the optical performances such as the light amount stability and the efficiency of frequency conversion are instable since the light modulator, the beam expansion unit, the light intensity homogenization unit or the optics unit are individually provided as discrete elements, use of the wavelength conversion parts in the ferroelectric crystal substrate solves these problems.

As one such example of equipping the device with multiple functions, the light modulator may be disposed between the second periodically poled part (the second wavelength conversion part) and the exit surface to thereby modulate the light which is outputted from the second periodically poled part. Of course, the light modulator may replace use of the second periodically poled part as the wavelength conversion part.

As such a light modulator, a plurality of first electrodes may be disposed opposed to the metal film across the light modulator, and in accordance with an electric field applied between the plurality of first electrodes and the metal film, Bragg diffraction or Raman-Nath diffraction may be developed inside the periodically poled structures, which realizes spatial light modulation.

Further, the beam expansion unit or the light intensity homogenization unit may be disposed between the second wavelength conversion part and the light modulator. For instance, in the event that the beam expansion unit is disposed, it is possible to shape the light into a desired shape before the light reaches the light modulator. Meanwhile, in the event that the light intensity homogenization unit is disposed, it is possible to homogenize the light intensity of the light before the light reaches the light modulator.

Further, the optics unit may be disposed between the light modulator and the exit surface and a first lens of the optics unit may accordingly converge the light from the light modulator at a desired position. When a varifocal lens is used as the first lens, it is possible to adjust the condensing position of the light. Describing more specifically, the second electrode may be disposed opposed to the metal film across the optics unit, a poled structure may be disposed in the optics unit such that the direction of polarization caused by an applied electric field becomes reversed between the first lens and a section surrounding the first lens, and in accordance with the electric field applied between the second electrode and the metal film, the refractive index may be changed between the first lens and the section surrounding the first lens, to thereby change the focal length of the first lens.

Further, a lens group may be disposed in which a plurality of first lenses may be arranged along the direction in which light propagates inside the optics unit. As the plurality of first lenses are combined in such a fashion, advanced performances such as the performances of projection and imaging are obtained. Further, a plurality of such lens groups may be disposed in the orthogonal direction to the direction in which light propagates inside the optics unit. Still further, the plurality of such lens groups may be divided into one or more groups and the amount by which the focal length of the first lenses is changed may be controlled for each one of such divided lens groups, in which case the amount of focus can be changed for each divided area.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. An optical device, comprising:
a ferroelectric crystal substrate, formed by a ferroelectric crystal, that includes an incident surface upon which light impinges, an exit surface which is opposed to the incident surface, a first periodically poled part which is disposed between the incident surface and the exit surface, a second periodically poled part which has a periodically poled structure different from a periodically poled structure of the first periodically poled part and disposed between the first periodically poled part and the exit surface, and a support surface which is different from the incident surface or the exit surface;
a support substrate that includes an opposed surface which is opposed to the support surface; and
a metal film, disposed between the support surface and the opposed surface, that integrates the ferroelectric crystal substrate with the support substrate,
wherein the first periodically poled part and the second periodically poled part are formed in the one ferroelectric crystal substrate;
the ferroelectric crystal substrate is shaped like a flat plate and structured so as to include a slab waveguide which guides light incident upon the incident surface to the exit surface and makes light propagate straight inside the slab waveguide;
the metal film covers the entire support surface and the entire opposed surface and functions as a common electrode of the first periodically poled part and the second periodically poled part; and
the first periodically poled part performs wavelength conversion of light that impinges upon the incident surface and the second periodically poled part performs wavelength conversion or modulation of light that is outputted from the first periodically poled part.

2. The optical device of claim 1, wherein the first periodically poled part is a first wavelength conversion part that forms any one of a second harmonic generation part, a third harmonic generation part, a sum frequency generation part, a difference frequency generation part and an optical parametric oscillator.

3. The optical device of claim 1, wherein the second periodically poled part is a second wavelength conversion part that forms any one of a second harmonic generation part, a third harmonic generation part, a sum frequency generation part, a difference frequency generation part and an optical parametric oscillator.

4. The optical device of claim 1, wherein the second periodically poled part is a second wavelength conversion part, and the ferroelectric crystal substrate includes a light modulator, disposed between the second periodically poled part and the exit surface, that modulates light which is outputted from the second periodically poled part.

5. The optical device of claim 4, further comprising a plurality of first electrodes which are disposed opposed to the metal film across the light modulator,
wherein the light modulator performs light modulation by Bragg diffraction or Raman-Nath diffraction inside the light modulator in accordance with an electric field which is applied between the plurality of first electrodes and the metal film.

6. The optical device of claim 4, wherein the ferroelectric crystal substrate includes a beam expander which is disposed between the incident surface and the light modulator.

7. The optical device of claim 4, wherein the ferroelectric crystal substrate includes a light intensity homogenizer which is disposed between the incident surface and the light modulator.

8. The optical device of claim 4, wherein the ferroelectric crystal substrate includes an optical system, disposed between the light modulator and the exit surface, that has a first lens for converging light which is outputted from the light modulator.

9. The optical device of claim 8, wherein the first lens is a varifocal lens.

10. The optical device of claim 9, further comprising a second electrode which is disposed opposed to the metal film across the optical system,
wherein the optical system has a periodically poled structure in which the orientation of polarization caused by an applied electric field is reversed between the first lens and a section surrounding the first lens, and in accordance with an electric field applied between the second electrode and the metal film, the optical system changes the refractive index between the first lens and the section surrounding the first lens and accordingly changes the focal length of the first lens.

11. The optical device of claim 9, wherein the optical system includes a lens group in which the first lenses are arranged along the direction in which light propagates inside the optical system.

12. The optical device of claim 11, wherein the lens groups are disposed in the orthogonal direction to the direction in which light propagates inside the optical system.

13. The optical device of claim 12, wherein the lens groups are divided into one or more groups, and
the focal length of the first lenses is changed with respect to each divided lens groups.

14. An exposure apparatus, comprising:
the optical device of claim 8;
a light source that outputs light to the incident surface of the ferroelectric crystal substrate; and
a second lens which is disposed between the exit surface of the ferroelectric crystal substrate and a substrate-to-be-exposed,
wherein the first lens converges light from the light modulator in the orthogonal direction to the crystallographic axial direction of the ferroelectric crystal substrate, and
the second lens converges light from the exit surface of the ferroelectric surface along at least the crystallographic axial direction.

15. The exposure apparatus of claim 14,
wherein the light source emits infrared laser light,
the first periodically poled part is a second harmonic generation part,
the second periodically poled part is a sum frequency generation part, and
the light modulator is disposed between the second periodically poled part and the exit surface.

16. An exposure apparatus, comprising:
the optical device of claim 4;
a light source that outputs light to the incident surface of the ferroelectric crystal substrate; and
an optical system that guides to a substrate-to-be-exposed the light which is outputted from the exit surface after getting modulated by the light modulator of the ferroelectric crystal substrate.

17. The exposure apparatus of claim 16,
wherein the light source emits infrared laser light,
the first periodically poled part is a second harmonic generation part,
the second periodically poled part is a sum frequency generation part, and
the light modulator is disposed between the second periodically poled part and the exit surface.

18. The optical device of claim 1, wherein the second periodically poled part is a light modulator that modulates the light which is outputted from the first periodically poled part.

19. The optical device of claim 18, further comprising a plurality of first electrodes which are disposed opposed to the metal film across the light modulator,
wherein the light modulator performs light modulation by Bragg diffraction or Raman-Nath diffraction inside the light modulator in accordance with an electric field which is applied between the plurality of first electrodes and the metal film.

20. The optical device of claim 18, wherein the ferroelectric crystal substrate includes a beam expander which is disposed between the incident surface and the light modulator.

21. The optical device of claim 18, wherein the ferroelectric crystal substrate includes a light intensity homogenizer which is disposed between the incident surface and the light modulator.

22. The optical device of claim 18, wherein the ferroelectric crystal substrate includes an optical system, disposed between the light modulator and the exit surface, that has a first lens for converging light which is outputted from the light modulator.

23. The optical device of claim 22, wherein the first lens is a varifocal lens.

24. The optical device of claim 23, further comprising a second electrode which is disposed opposed to the metal film across the optical system,
wherein the optical system has a periodically poled structure in which the orientation of polarization caused by an applied electric field is reversed between the first lens and a section surrounding the first lens, and in accordance with an electric field applied between the second electrode and the metal film, the optical system changes the refractive index between the first lens and the section surrounding the first lens and accordingly changes the focal length of the first lens.

25. The optical device of claim 23, wherein the optical system includes a lens group in which the first lenses are arranged along the direction in which light propagates inside the optical system.

26. The optical device of claim 25, wherein the lens groups are disposed in the orthogonal direction to the direction in which light propagates inside the optical system.

27. The optical device of claim 26, wherein the lens groups are divided into one or more groups, and
the focal length of the first lenses is changed with respect to each divided lens groups.

28. An exposure apparatus, comprising:
the optical device of claim 22;
a light source that outputs light to the incident surface of the ferroelectric crystal substrate; and
a second lens which is disposed between the exit surface of the ferroelectric crystal substrate and a substrate-to-be-exposed,
wherein the first lens converges light from the light modulator in the orthogonal direction to the crystallographic axial direction of the ferroelectric crystal substrate, and
the second lens converges light from the exit surface of the ferroelectric surface along at least the crystallographic axial direction.

29. An exposure apparatus, comprising:
the optical device of claim 18;
a light source that outputs light to the incident surface of the ferroelectric crystal substrate; and
an optical system that guides to a substrate-to-be-exposed the light which is outputted from the exit surface after getting modulated by the light modulator of the ferroelectric crystal substrate.

30. A laser apparatus, comprising:
the optical device of claim 1; and
a light source that outputs light to the incident surface of the ferroelectric crystal substrate.

31. The laser apparatus of claim 30,
wherein the light source emits infrared laser light,
the first periodically poled part is a second harmonic generation part, and
the second periodically poled part is a sum frequency generation part.

* * * * *